(12) United States Patent
Maki

(10) Patent No.: US 8,487,312 B2
(45) Date of Patent: Jul. 16, 2013

(54) SEMICONDUCTOR DEVICE AND METHOD OF MANUFACTURING THE SAME

(75) Inventor: Yukio Maki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/473,339

(22) Filed: May 16, 2012

(65) Prior Publication Data

US 2012/0306029 A1 Dec. 6, 2012

(30) Foreign Application Priority Data

Jun. 3, 2011 (JP) ................................ 2011-125502

(51) Int. Cl.
*H01L 29/04* (2006.01)

(52) U.S. Cl.
USPC ........ 257/59; 257/72; 257/347; 257/E29.277; 257/E21.412; 438/151; 438/155; 438/479

(58) Field of Classification Search
USPC .............. 257/59, 72, 347, E29.277, E21.412; 438/151, 155, 479
See application file for complete search history.

(56) References Cited

U.S. PATENT DOCUMENTS

| 6,177,294 B1 * | 1/2001 | Nakatake | 438/106 |
| 6,831,852 B2 | 12/2004 | Ishigaki et al. | |
| 6,853,022 B2 | 2/2005 | Koga et al. | |

FOREIGN PATENT DOCUMENTS

| JP | 2001-068548 | 3/2001 |
| JP | 2004-079696 | 3/2004 |
| JP | 2004-200598 | 7/2004 |

* cited by examiner

*Primary Examiner* — Tu-Tu Ho
(74) *Attorney, Agent, or Firm* — McDermott Will & Emery

(57) ABSTRACT

To provide a semiconductor device with a TFT, capable of reducing the electric resistance of a power supply wiring without increasing the off-current. The semiconductor device includes an insulating film with a surface; a semiconductor layer which is formed over the surface of the insulating film and which includes a channel region and a pair of source/drain regions and sandwiching the channel region; and a power supply wiring for supplying power to the source region. A concave portion is formed in the surface of the insulating film. The power supply wiring includes a layer formed from the same layer as the semiconductor layer, and has a first portion formed over the surface of the insulating film and a second portion formed in the concave portion. The bottom of the second portion is covered with an insulator.

12 Claims, 19 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2011-125502 filed on Jun. 3, 2011 including the specification, drawings and abstract is incorporated herein by reference in its entirety.

BACKGROUND

The invention relates to semiconductor devices and methods of manufacturing the semiconductor devices, and in particular relates to a semiconductor device having a thin film transistor and the method of manufacturing the semiconductor device.

As further integration of a semiconductor device and a reduction in size of a semiconductor device proceed, a soft error may be caused due to storing information into a memory node portion in a volatile memory referred to as an SRAM (Static Random Access Memory). To deal with this problem, Japanese Patent Laid-Open No. 2004-79696 (Patent Document 1) and Japanese Patent Laid-Open No. 2004-200598 (Patent Document 2) disclose a semiconductor device in which a capacitor as a DRAM (Dynamic Random Access Memory) is added to an SRAM circuit that uses a thin film transistor called a TFT (Thin Film Transistor) as a load transistor. In each of Patent Document 1 and Patent Document 2, a charge is retained in the capacitor in place of a memory node portion, and the potential of the capacitor is held by the flip-flop circuit constituting the SRAM circuit. For this reason, the occurrence of a soft error due to alpha rays can be restrained as compared with an SRAM in which a charge is stored in the memory node portion. Furthermore, because at least a part of the flip-flop circuit is provided above a bit line, the semiconductor device can be miniaturized.

Japanese Patent Laid-Open No. 2001-68548 (Patent Document 3) discloses a semiconductor device in which a power wiring and a signal wiring constituted by copper are formed from the same layer. The semiconductor device can reduce the signal delay in the signal wiring without reducing the wiring capacitance of the power wiring. According to Patent Document 3, the lower portion of the power wiring is embedded into an insulating film having a dielectric constant higher than an insulating film in which the power wiring is formed, so that the wiring capacitance of the power wiring is increased.

SUMMARY

According to Japanese Patent Laid-Open No. 2004-79696 and Japanese Patent Laid-Open No. 2004-200598, a power supply wiring which is electrically connected to the load transistor and which supplies a power-supply voltage to the load transistor is formed in polysilicon in which a load transistor is formed. As the size of a semiconductor device reduces, the power supply wiring is thinned. Then, the electric resistance of the power supply wiring increases. If the electric resistance of the power supply wiring increases, a voltage drop in the power supply wiring increases, a voltage supplied to a memory cell portion of an SRAM becomes unstable, and data stored in some of memory cells may be destroyed.

To restrain the increase in the electric resistance of the power supply wiring, the concentration of impurity ions implanted into the polysilicon constituting the power supply wiring is preferably increased. If the electric resistance of the power supply wiring reduces by using this measure, then in particular when the power supply wiring and a source/drain region of a load transistor (TFT) are formed from the same polysilicon layer, the concentration of the impurity ions implanted into the source/drain region of the TFT along with the power supply wiring increases. Then, a leakage current (off-current) that flows between the source/drain region and a channel region when the load transistor is off may increase, and thus the on/off control of the load transistor may become difficult.

Moreover, Japanese Patent Laid-Open No. 2001-68548 discloses a technique of reducing the electric resistance of a copper wiring is disclosed, but not a technique of reducing the electric resistance in the TFT.

SUMMARY

The present invention has been made to solve the problems, and provides a semiconductor device with a TFT and the method of manufacturing the semiconductor device which reduces the electric resistance of a power supply wiring without increasing the off-current.

A semiconductor device according to an embodiment of the invention has the following configuration. The semiconductor device includes an insulating film with a surface; a semiconductor layer which is formed over the surface of the insulating film and which includes a channel region and a pair of sources/drain regions sandwiching the channel region; and a power supply wiring for supplying a power supply to the source region. A concave portion is formed in the surface of the insulating film. The power supply wiring includes a layer formed from the same layer as the semiconductor layer, and has a first portion formed over the surface of the insulating film and a second portion formed in the concave portion. The entire bottom of the second portion is covered with an insulator.

A method of manufacturing a semiconductor device according to an embodiment of the invention includes the following steps. First, an insulating film having a surface and also having a concave portion in the surface is formed. Over the surface of the insulating film, a semiconductor layer including a channel region and a pair of sources/drain regions sandwiching the channel regions is formed, and a power supply wiring for supplying a power supply to the source region is formed. The power supply wiring is formed so that it includes a portion formed from the same layer as the semiconductor layer, so that it has a first portion formed over the surface of the insulating film and a second portion formed in the recess, and so that the bottom of the second portion is covered with an insulator.

According to the embodiment, the power supply wiring including the same layer as the semiconductor layer including a pair of source/drain regions has the second portion formed in the concave portion in addition to the first portion. For this reason, in the power supply wiring, as compared with a power supply wiring having only the first portion, the area of a cross section that intersects with a direction in which the power supply wiring extends increases. Accordingly, the electric resistance of the power supply wiring reduces without increasing the impurity concentration of the power supply wiring.

According to the manufacturing method of the embodiment, the power supply wiring including the same layer as the semiconductor layer including a pair of source/drain regions is formed to have the second portion formed in the concave portion in addition to the first portion. For this reason, in the power supply wiring, as compared with a power supply wiring having only the first portion, the area of a cross section that intersects with a direction in which the power supply wiring extends increases. Accordingly, the electric resistance of the power supply wiring reduces without increasing the impurity concentration of the power supply wiring. Moreover, because the power supply wiring has the second portion, a large amount of impurities may be implanted into the power supply wiring, as compared with a power supply wiring having only the first portion.

DETAILED DESCRIPTION

Embodiments of the invention are described with reference to the accompanying drawings. (Embodiment 1) First, the configuration of a semiconductor device as the embodiment is described with a memory cell using a TFT as a load transistor in FIG. 1.

Figure 1:
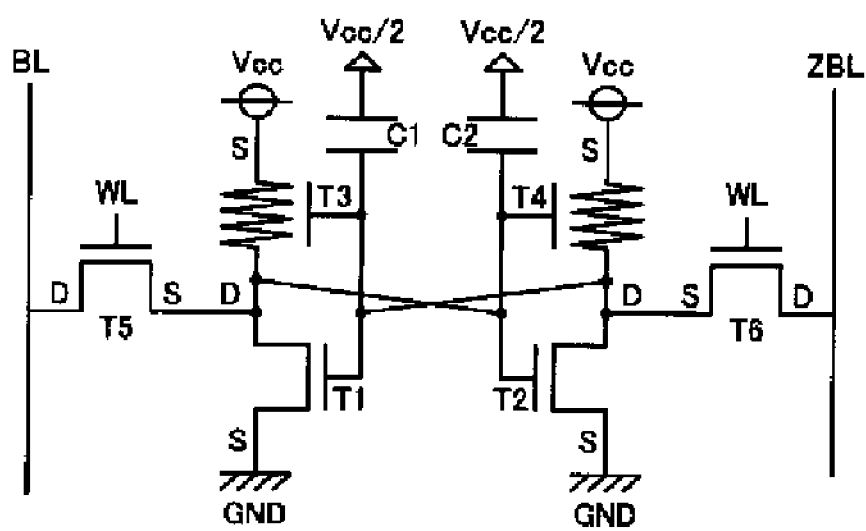
FIG. 1 is an equivalent circuit diagram of a memory cell constituting a semiconductor device according to Embodiment 1 of the invention.

With reference to FIG. 1, the semiconductor device in the embodiment includes, as a memory cell, an SRAM including a pair of bit lines BL and ZBL, a word line WL, a flip-flop circuit, and a pair of access transistors T5 and T6.

The flip-flop circuit includes driver transistors T1 and T2 and load transistors T3 and T4. The driver transistor T1 and the load transistor T3 form a first CMOS (Complementary Metal Oxide Semiconductor) inverter, and the driver transistor T2 and the load transistor T4 form a second CMOS inverter. The flip-flop circuit is constituted by these two CMOS inverters. The SRAM is a semiconductor memory which, by having a flip-flop circuit, eliminates the "refresh" processing in which a charge stored as information is restored at a predetermined cycle. The SRAM in the embodiment further includes capacitors C1 and C2 as a DRAM.

The driver transistors T1 and T2 constituting the flip-flop circuit are n-channel type MOS transistors. The load transistors T3 and T4 are p-channel type TFT. The access transistors T5 and T6 are n-channel type MOS transistors. Therefore, the SRAM of the embodiment is an "Advanced SRAM", in which the load transistor is a TFT and a capacitor as the DRAM is added.

In the flip-flop circuit, the gate electrodes of the driver transistor T1 and the load transistor T3 and the capacitor C1 are electrically connected to each other, and these are electrically connected to a source electrode S of the access transistor T6. The source electrode S of the access transistor T6 is electrically connected to drain electrodes D of the driver transistor T2 and the load transistor T4, and a region where these are connected serves as a first memory node portion.

The gate electrodes of the driver transistor T2 and the load transistor T4 and the capacitor C2 are electrically connected to each other, and these are electrically connected to a source electrode S of the access transistor T5. The source electrode S of the access transistor T5 is electrically connected to drain electrodes D of the driver transistor T1 and the load transistor T3, and a region where these are connected serves as a second memory node portion.

The source electrodes S of the driver transistors T1 and T2 are electrically connected to a GND potential, and the source electrodes S of the load transistors T3 and T4 are electrically connected to a Vcc wiring (a power supply wiring) to which a voltage Vcc is applied. Furthermore, the capacitors C1 and C2 are electrically connected to a Vcc/2 wiring to which a voltage Vcc/2 (½ of the voltage Vcc) is applied. Each of a pair of bit lines BL and ZBL is connected to a drain electrode D of each of a pair of access transistors T5 and T6.

Figure 2:
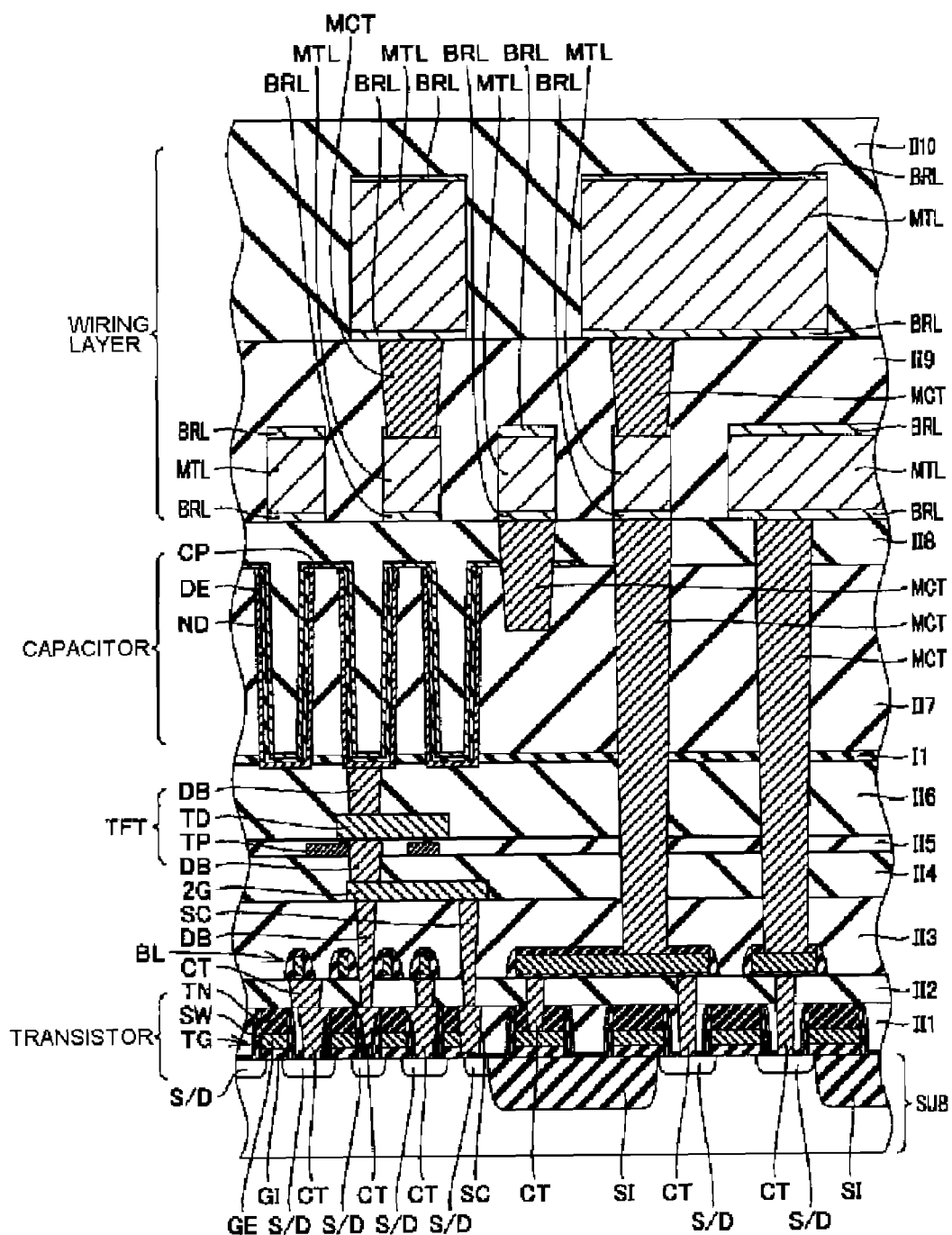
FIG. 2 is a schematic cross-sectional view for specifically illustrating the equivalent circuit in FIG. 1.

Next, the more specific configuration of the semiconductor device in FIG. 1 is described by using a schematic cross-sectional view in FIG. 2. The cross-sectional view in FIG. 2 is not a view showing an aspect of a cross section in a specific region but is a collection of the transistors, capacitors, and the like in FIG. 1 for illustrating the shape which each element exhibits in the semiconductor device.

With reference to FIG. 2, the semiconductor device according to the embodiment is formed in one of the major surfaces of a p-type semiconductor substrate SUB including silicon single crystal.

The surface of the semiconductor substrate SUB is electrically isolated by STI (Shallow Trench Isolation). The STI is formed by embedding an insulating layer SI into a groove formed in the surface of the semiconductor substrate SUB. A plurality of transistors TG is formed in the surface of the semiconductor substrate SUB electrically isolated by the STI.

The transistor TG includes a pair of source/drain regions S/D, a gate insulating film GI, a gate electrode GE, and an insulating film TN. Each of the pair of source/drain regions S/D is formed in the surface of the semiconductor substrate SUB. The gate insulating film GI is formed over the surface of the semiconductor substrate SUB sandwiched by the pair of source/drain regions S/D. The gate electrode GE and the insulating film TN are formed over the gate insulating film GI, and have a stacked structure of the gate electrode GE and the insulating film TN. The gate electrode GE has the polycide structure in which a thin film of polysilicon and that of tungsten are stacked. The insulating film TN is constituted by a silicon oxide film and/or a silicon nitride film, and serves as a stopper film for etching in performing the self-aligned processing with the insulating film TN as a mask. A side wall insulating film SW is formed on the side walls of the gate electrode GE and the insulating film TN. The side wall insulating film SW is preferably a combination of a silicon oxide film and a silicon nitride film.

An interlayer insulator II1 is formed to be embedded between the adjacent stacked structures of the gate electrode GE and the insulating film TN of the transistors TG. A contact hole is formed in the interlayer insulator II1, and conductive layers CT and SC are embedded into the contact hole. The conductive layers CT and SC are formed preferably by polysilicon or tungsten.

Interlayer insulating layers II2, II3, II4, II5, and II6 constituted by a silicon oxide film are sequentially formed so as to contact the upper surface of the interlayer insulator II1. An interlayer insulator I1 constituted by a silicon nitride film is formed to contact the upper surface of the interlayer insulator II6. Furthermore, interlayer insulators II7, II8, II9, and II10 constituted by a silicon oxide film are sequentially formed to contact the upper surface of the interlayer insulator I1.

Over the interlayer insulator II2, a plurality of bit lines BL is formed to be spaced from each other. The bit line BL extends in the depth direction of the plane in FIG. 2. A side wall insulating film is formed to contact the side wall of the bit line BL.

The bit line BL is electrically connected to a source/drain electrode SD through one or more contact conductive layers CT.

A lower layer wiring 2G is formed over the interlayer insulator II3. The lower layer wiring 2G is a wiring that is arranged to electrically connect a capacitor formed in a further upper layer to the transistor TG. The lower layer wiring 2G is formed preferably in a region where it generally overlaps with the capacitor in the plane view. The lower layer wiring 2G is constituted preferably by a polysilicon film including impurity ions. Moreover, when the transistor TG formed in an underlayer is an n-channel transistor, the lower layer wiring 2G may be constituted by polysilicon including n-type impurity ions to facilitate the electric connection with the transistor TG.

A polysilicon layer TP is formed over the interlayer insulator II4. The polysilicon layer TP is a semiconductor layer constituted by polysilicon including impurity ions introduced, and includes the channel region of the TFT as the load transistors T3 and T4 (see FIG. 1) of the SRAM and a pair of source/drain regions sandwiching the channel region. Moreover, the polysilicon layer TP includes a part of the power supply wiring for supplying power to the TFT. The polysilicon layer TP is formed preferably in a region where it generally overlaps with the capacitor in the plane view.

A gate electrode layer TD of the TFT is formed over the interlayer insulator II5. The gate electrode layer TD is preferably a semiconductor layer containing polysilicon including impurity ions.

The electric connection between the gate electrode layer TD and the lower layer wiring 2G is made preferably by a conductive layer referred to as a "data node contact" DB. The data node contact DB, in the middle of extending from the gate electrode layer TD toward the lower layer wiring 2G, contacts an end of the polysilicon layer TP and is electrically connected to the polysilicon layer TP. The data node contact DB is a conductive layer for forming the flip-flop circuit (cross-coupled circuit) of the SRAM, and is formed by a semiconductor layer including polysilicon including impurity ions as with the gate electrode layer TD. The data node contact DB is preferably formed to extend in a direction approximately perpendicular to the major surface of the semiconductor substrate SUB to extend through the interlayer insulator from the gate electrode layer TD to the lower layer wiring 2G.

The data node contact DB may be formed in a layer above the gate electrode layer TD to electrically connect the gate electrode layer TD and the capacitor, or may be formed in a layer under the lower layer wiring 2G to electrically connect the lower layer wiring 2G and the contact conductive layer CT. The data node contact DB may be formed to extend from the capacitor through the gate electrode layer TD, the polysilicon layer TP, and the lower layer wiring 2G and reach the contact conductive layer CT.

The capacitor is formed over the interlayer insulator II6. The capacitor is electrically connected to the data node contact DB by contacting the upper surface of the data node contact DB.

A metal wiring MTL is formed above the capacitor, such as over the interlayer insulator II8 and over the interlayer insulator II9. Preferably, the metal wiring MTL includes aluminum, an aluminum copper alloy, copper, and tungsten, and the upper surface and lower surface of the metal wiring are covered with a barrier metal BRL including tantalum, titanium, and titanium nitride. Moreover, the connection between each metal wiring MTL or the connection between the metal wiring MTL and the bit line BL is preferably made by a metal contact conductive layer MCT including copper and tungsten.

Next, with reference to FIG. 3 to FIG. 7, a more specific configuration of the memory cell constituting the semiconductor device of the embodiment is described in order from the lower layer.

Figure 5:
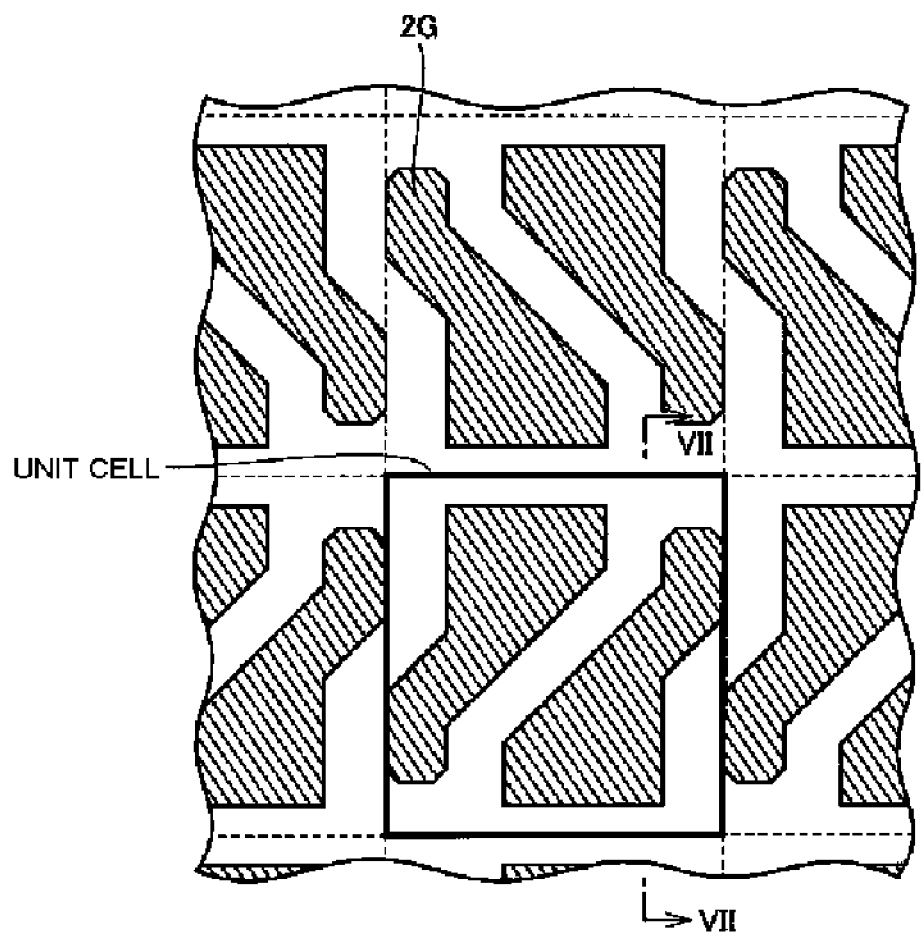
FIG. 5 is a schematic plan view showing an aspect of the region of generally the third layer from a major surface of a semiconductor substrate of the memory cell according to Embodiment 1 of the invention.
Figure 6:
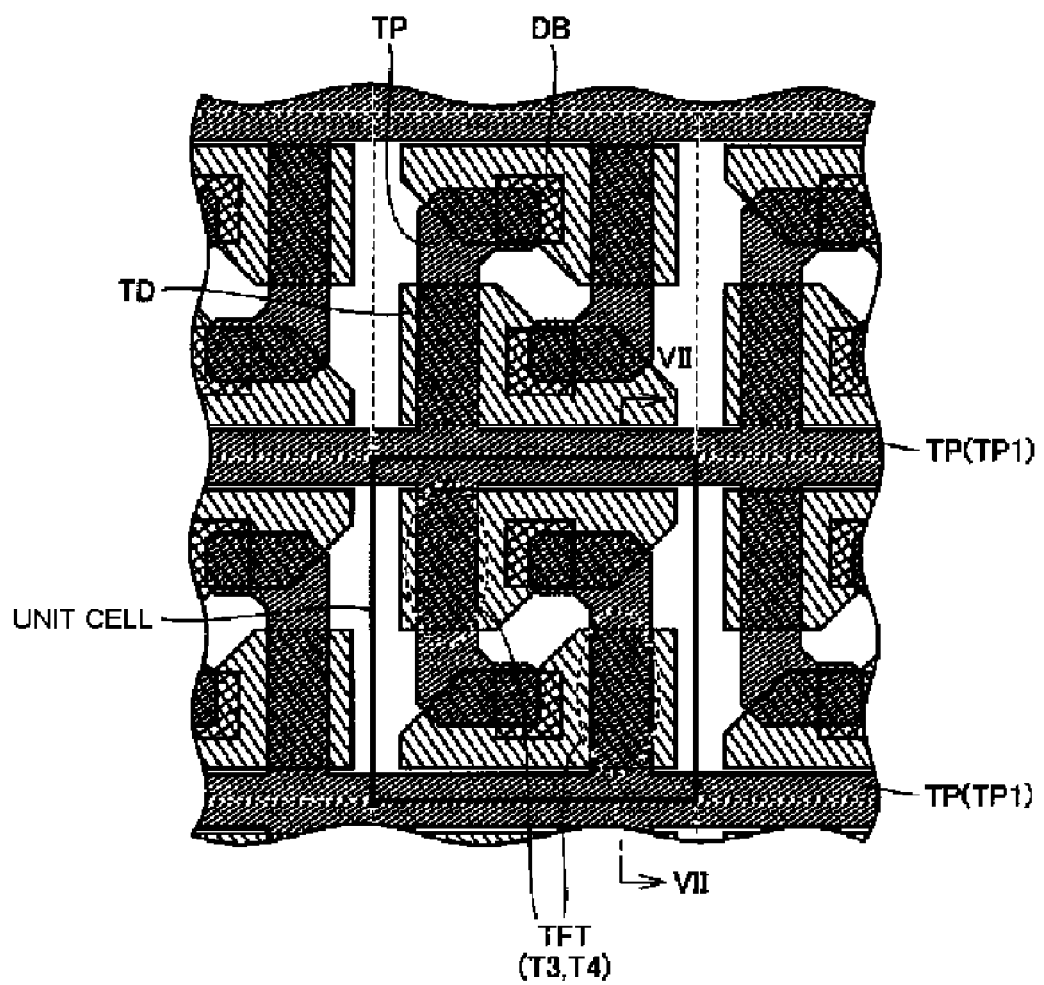
FIG. 6 is a schematic plan view showing an aspect of the region of generally the fourth layer from a major surface of a semiconductor substrate of the memory cell according to Embodiment 1 of the invention.
Figure 7:
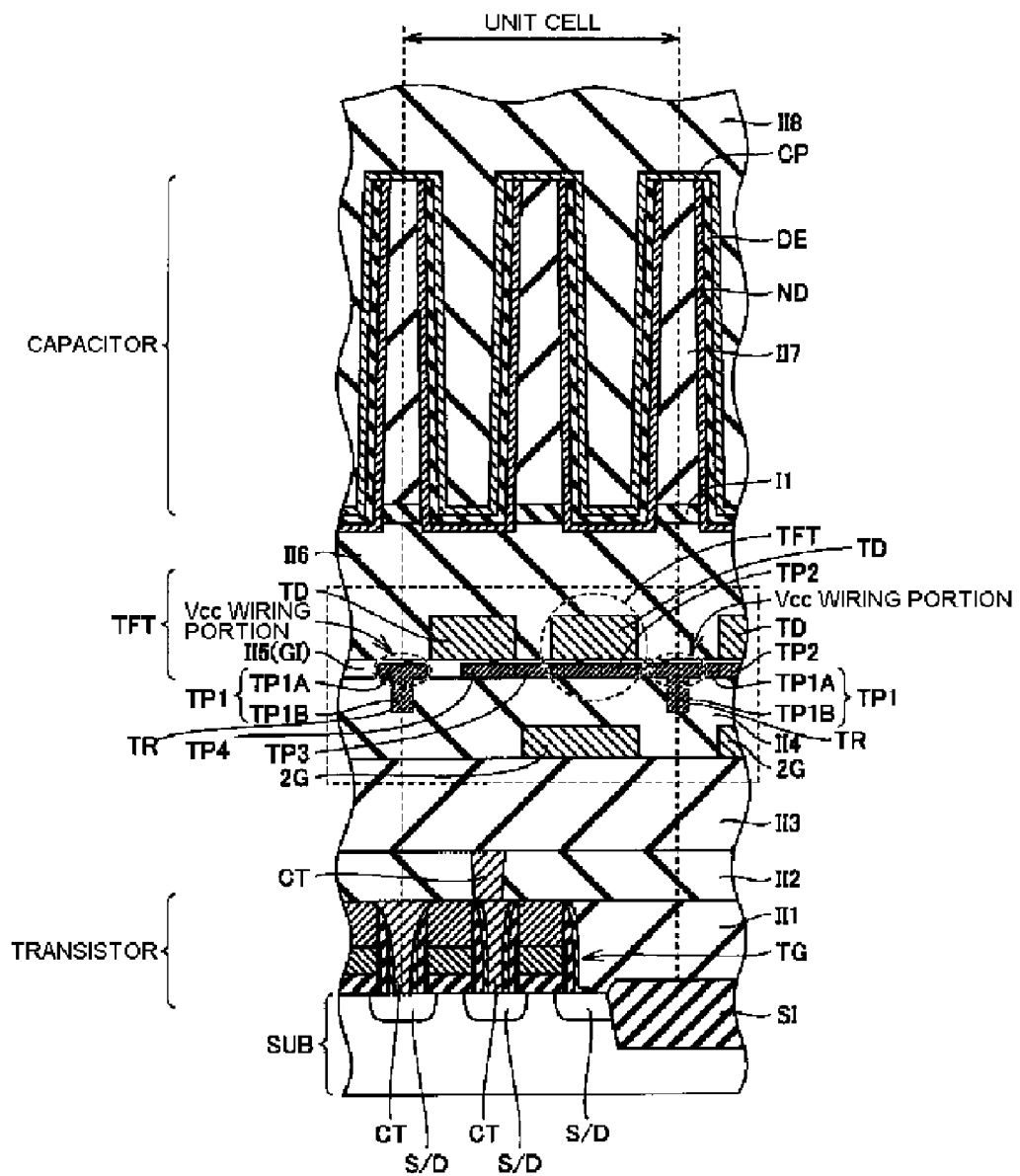
FIG. 7 is a schematic cross-sectional view of the portion along a VII-VII line in FIG. 3 to FIG. 6.

With reference to FIG. 3 to FIG. 6, a region surrounded by a rectangular in the figure shows a unit cell, whereas a cross-sectional view showing an aspect in the unit cell and an aspect near both the ends of the unit cell is shown in FIG. 7.

Figure 3:
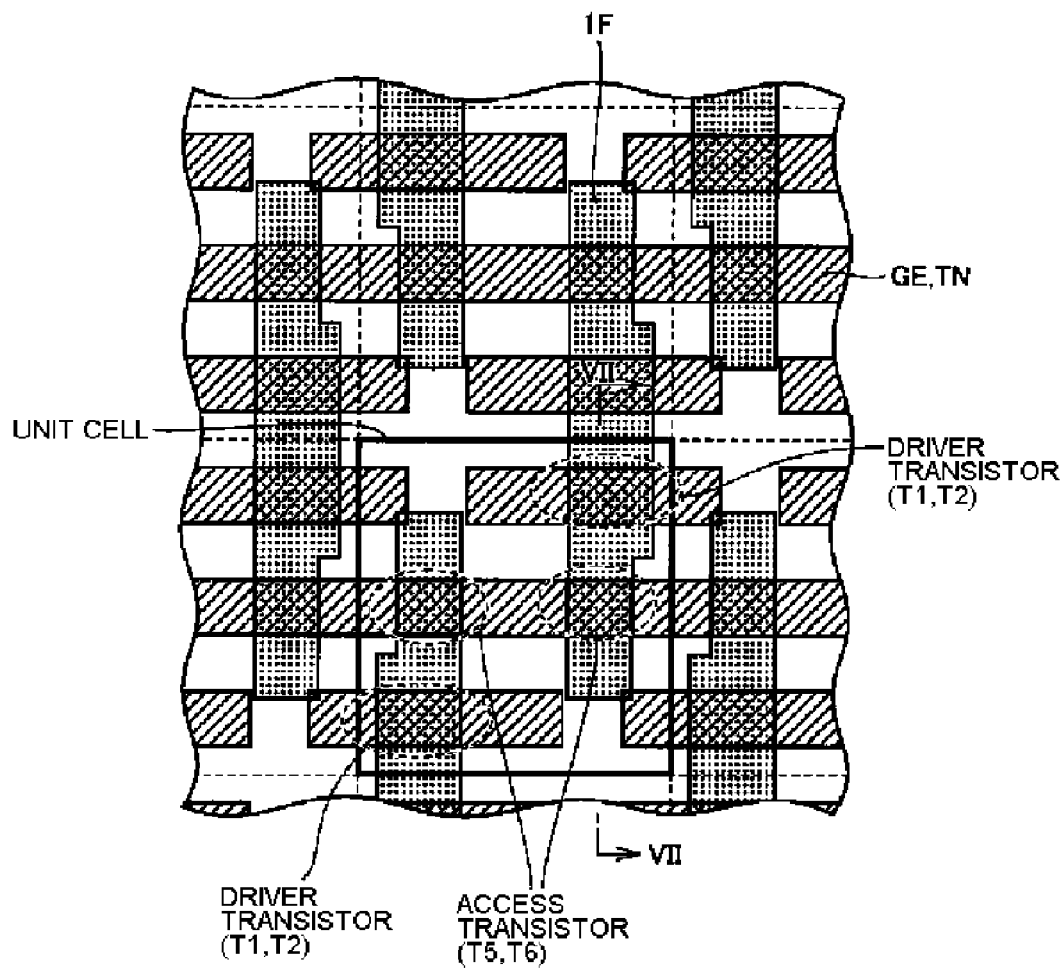
FIG. 3 is a schematic plan view showing an aspect of the region of generally the first layer from a major surface of a semiconductor substrate of the memory cell according to Embodiment 1 of the invention.

FIG. 3 shows a configuration of the driver transistor and the access transistor. With reference to FIG. 3 and FIG. 7, the gate electrode GE and the insulating film TN are formed to cross an active region 1F. In the active region 1F, a pair of source/drain regions is formed to sandwich the gate electrode GE and the insulating film TN in the plane view. Thus, the driver transistor and the access transistor are constituted. Accordingly, among a pair of transistors TG formed in the unit cell of FIG. 7, the left transistor TG can represent each of the driver transistors T1 and T2, and the right transistor TG may represent each of the access transistors T5 and T6.

Figure 4:
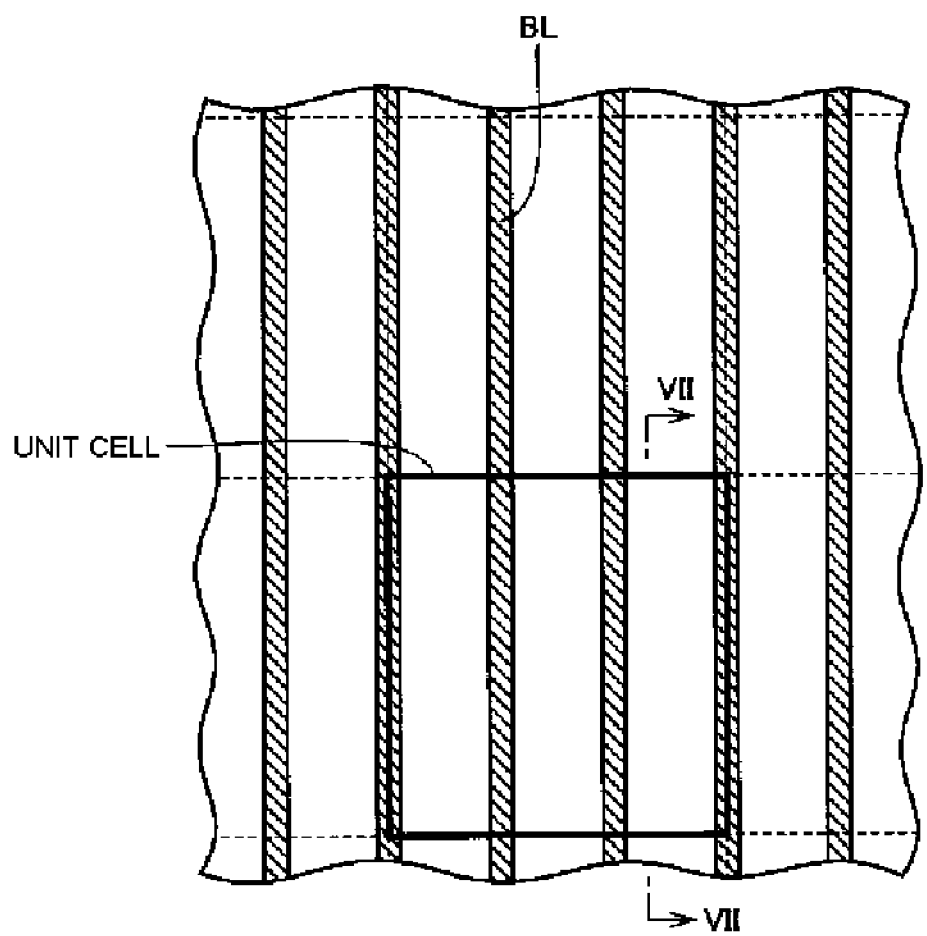
FIG. 4 is a schematic plan view showing an aspect of the region of generally the second layer from a major surface of a semiconductor substrate of the memory cell according to Embodiment 1 of the invention.

With reference to FIG. 4 and FIG. 7, although the bit line BL is formed over the interlayer insulator II2 of FIG. 7 to extend in the horizontal direction in FIG. 7, it does not appear in FIG. 7. The bit line BL is electrically connected to a lower layer via the contact conductive layer CT.

Referring to FIG. 5 and FIG. 7, the lower layer wiring 2G preferably has a shape in FIG. 5, such as a shape that extends in the horizontal direction and in the depth direction of the plane in FIG. 7.

Referring to FIG. 6 and FIG. 7, over the interlayer insulators II4 (insulating film) and II5, a pattern of the polysilicon layer TP (semiconductor layer) and that of the gate electrode layer TD are formed, respectively. By overlapping of the polysilicon layer TP and the gate electrode layer TD in the plane view, the TFT constituting the load transistors T3 and T4 is formed. The polysilicon layer TP in FIG. 6 is divided into polysilicon layers TP1 to TP4 and shown in FIG. 7.

Among regions over a VII-VII line in FIG. 6, a region where the patterns of the polysilicon layer TP and the gate electrode layer TD overlap with each other in a lower right region of the unit cell is a region where the polysilicon layer TP2 and the gate electrode layer TD in FIG. 7 are stacked. This region corresponds to the TFT surrounded by a dotted line inside the unit cell in FIG. 6.

Among the regions over the VII-VII line in FIG. 6, a region where the patterns of the polysilicon layer TP and the gate electrode layer TD overlap with each other in the upper right region of the unit cell does not constitute the TFT. The TFT is not constituted by the gate electrode layer TD on the left side in the unit cell and the polysilicon layer TP in FIG. 7. The gate electrode layer TD on the upper side of the unit cell of FIG. 6 and the TFT (a first one of the load transistors T3 and T4) surrounded by a dotted line on the lower right side of the unit cell are electrically connected to each other by the data node contact DB.

Moreover, a region where the gate electrode layer TD and the polysilicon layer TP on the upper side of the unit cell of FIG. 6 overlap with each other in the upper left region of FIG. 6 corresponds to the TFT (a second one of the load transistors T3 and T4). The TFT surrounded by a dotted line on the upper left of the unit cell and the gate electrode layer TD on the lower side of the unit cell in FIG. 6 are electrically connected to each other by the data node contact DB. Thus, in the unit cell in FIG. 6, two TFTs are formed, and a first TFT is electrically connected to the gate electrode layer TD constituting a second TFT by the data node contact DB. Therefore, a pair of load transistors T3 and T4 (see FIG. 1) corresponding to two TFTs constitutes the flip-flop circuit (cross-coupled circuit).

Within the region in FIG. 3 to FIG. 6, the pattern of each component is arranged to be symmetric with respect to a straight line extending in the horizontal direction in the center portion in the vertical direction of each view.

With reference to FIG. 7, in this cross section, the polysilicon layer TP of FIG. 6 has four regions of the polysilicon layers TP1, TP2, TP3, and TP4. That is, in the polysilicon layer TP, all the four regions of the polysilicon layers TP1, TP2, TP3, and TP4 are formed in the same layer. A pair of polysilicon layers TP1 is formed at the both ends of the unit cell. These correspond to the polysilicon layer TP which extends to overlap with a first side of the square indicative of the unit cell in FIG. 6 and with a second side facing to the first side (extends in the horizontal direction in FIG. 6). A pair of polysilicon layers TP1 in FIG. 7 extends in the depth direction of the plane of the view.

The polysilicon layer TP2 arranged directly under the gate electrode layer TD on the right side in FIG. 7 corresponds to the channel region of the TFT constituted by the gate electrode layer TD.

The polysilicon layer TP4 on the left side in the figure of the polysilicon layer TP2 corresponds to the drain region of the TFT. The polysilicon layer TP3 between the polysilicon layer TP2 and the polysilicon layer TP4 corresponds to a low concentration portion for relaxing the electric field in the drain of the TFT. The polysilicon layer TP1 on the right side in the figure of the polysilicon layer TP2 corresponds to the source region of the TFT, and corresponds to the power supply wiring (Vcc wiring) for supplying a power-supply voltage to this source region. If the polysilicon layer TP1 on the right side in the figure of the polysilicon layer TP2 corresponds to the source region of a first one of the load transistors T3 and T4 in FIG. 6, the polysilicon layer TP1 on the left side in the figure of the polysilicon layer TP2 corresponds to the source region of a second one of the load transistors T3 and T4 in FIG. 6.

The polysilicon layer TP3 has an impurity concentration lower than the polysilicon layers TP4 and TP1, and the polysilicon layer TP2 has an impurity concentration lower than the polysilicon layer TP3.

The polysilicon layer TP1 includes a same-layer polysilicon TP1A (a first portion) arranged over the surface of the interlayer insulator II4 and a polysilicon additional region TP1B (a second portion) formed under the polysilicon TP1A of the same layer. The polysilicon layer TP1 is formed when the polysilicon additional region TP1B is formed under and integrated with the same-layer polysilicon TP1A.

Among the polysilicon layer TP1, the same-layer polysilicon TP1A is a region formed from the same layer as the polysilicon layer TP2 or the like. The polysilicon layer TP1 preferably includes a layer formed from the same layer as the polysilicon layer TP2 or the like. The same-layer polysilicon TP1A and the polysilicon layers TP2, TP3, and TP4 all are preferably formed from the same layer, such as formed to cover the surface of the interlayer insulator II4 (insulating film).

In a region overlapping with the same-layer polysilicon TP1A in the plane view among the surface on the upper side of the interlayer insulator II4 in contact with the lower surface of the same-layer polysilicon TP1A and the polysilicon layers TP2, TP3, and TP4, a concave portion TR is formed. The inside of the concave portion TR is filled with the same material (including polysilicon) as that of the polysilicon layer TP. The region formed from the material including the polysilicon with which the inside the concave portion TR is filled is the polysilicon additional region.

The bottom of the polysilicon additional region TP1B (the surface closest to the semiconductor substrate SUB of the polysilicon additional region TP1B) is covered with an insulator. Specifically, in FIG. 7, the bottom is covered with the interlayer insulator II4. In the embodiment, the concave portion TR forming the polysilicon additional region TP1B is formed from the upper surface of the interlayer insulator II4 to a region inside the interlayer insulator II4. The bottom of the polysilicon additional region TP1B (the concave portion TR) is covered with an insulator, and thus a short circuit between the polysilicon layer TP1 and a wiring arranged in a layer under the polysilicon layer TP are restrained.

In the embodiment, the bottom of the polysilicon additional region TP1B (the bottom portion of the concave portion forming the polysilicon additional region TP1B) is above the uppermost surface of the lower layer wiring 2G. The area in the plane view of the polysilicon additional region TP1B may be smaller or larger than that of the same-layer polysilicon TP1A, or both of these areas may be approximately similar. Furthermore, the shape in the plane view of the polysilicon additional region TP1B can be any shape, such as a rectangle or a circle.

The capacitor has a configuration, in which in the side surface of a region formed in a groove in the vertical direction of FIG. 7, a dielectric film. DE constituted by the storage node ND and dielectrics is stacked in this order and the capacitor electrode CP that is a conductive thin film covering the groove and a surface, in which the groove is formed, is furthermore stacked.

Figure 8:
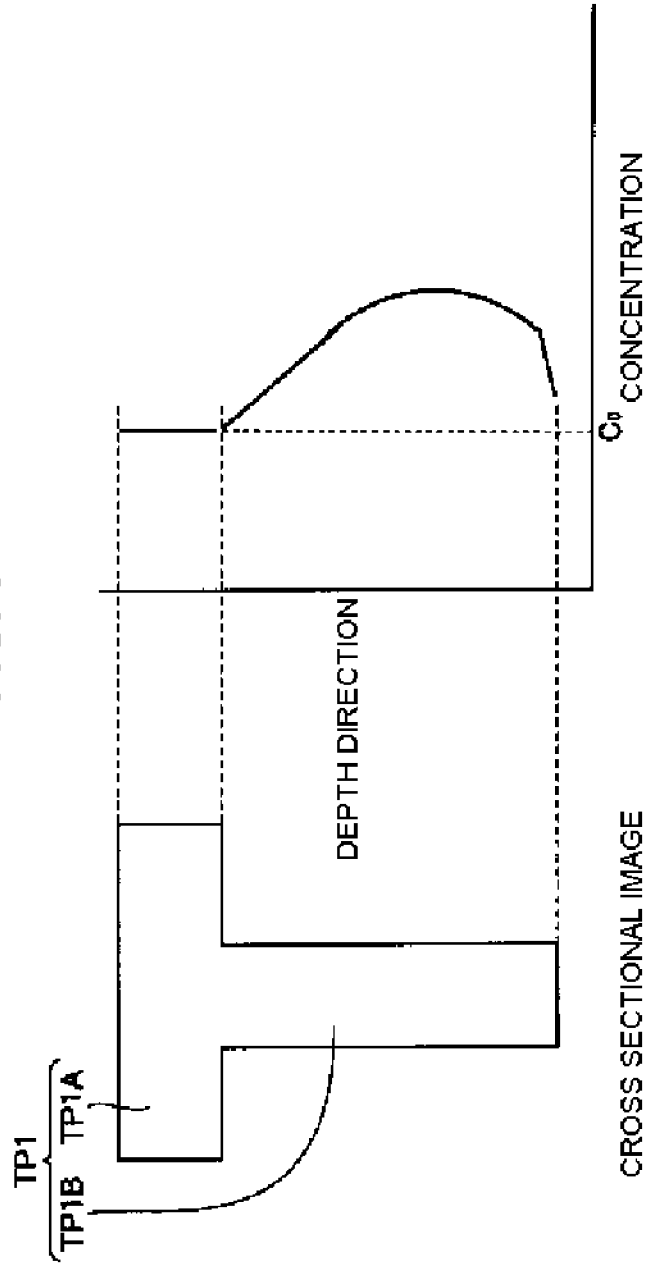
FIG. 8 is a profile showing the concentration distribution of impurity ions in a power supply wiring in FIG. 7.

The vertical axis of a graph in FIG. 8 indicates the location in the depth direction of the polysilicon layer TP1 in FIG. 7, and the horizontal axis indicates the concentration of impurity ions in each region (at each depth) of the polysilicon layer TP1 in FIG. 7. In the polysilicon layer TP1 in the embodiment, the polysilicon additional region TP1B preferably has a higher impurity concentration than the same-layer polysilicon TP1A. Specifically, the polysilicon additional region TP1B preferably has a higher concentration of impurity ions, such as a conductive boron in the p-type polysilicon layer TP, than the same-layer polysilicon TP1A.

To restrain the increase in the off-current, the concentration of impurity ions in the polysilicon layer TP2, which is the channel region, is preferably not excessively increased. Accordingly, the concentration of the impurity ions in the same-layer polysilicon TP1A, which is the same layer as the polysilicon layers TP2 to TP4 and is the source region, is preferably equal to or less than a reference concentration $C_0$ not to excessively increase in the region. The reference concentration $C_0$ may be the same as the concentration of the polysilicon layer TP4 as the drain region. In the polysilicon additional region TP1B, the impurity ions may be implanted at a concentration exceeding the reference concentration $C_0$. If the impurity concentration in the polysilicon additional region TP1B increases, the electric resistance of the polysilicon layer TP1 can be reduced further.

FIG. 8 shows the concentration of the impurity ions in each region of the polysilicon layer TP1. With reference to FIG. 8, a region in the vicinity of the middle of the depth of the polysilicon additional region TP1B may have a single peak at which the concentration of the impurity ions becomes the maximum. However, a plurality of (nor less than two) peaks may be formed inside the polysilicon additional region TP1B.

Next, a method of manufacturing the region, in which the TFT is formed, surrounded by the rectangular dotted line particularly in FIG. 7, among the memory cells of the semiconductor device in the embodiment in FIG. 3 to FIG. 7, is described referring to FIG. 9 to FIG. 15.

Figure 9:
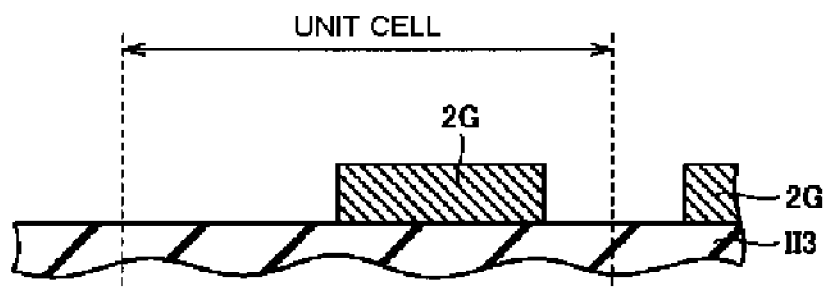
FIG. 9 is a schematic cross-sectional view showing the first step of the method of manufacturing the memory cell according to Embodiment 1 of the invention.

With reference to FIG. 9, over the interlayer insulator II3 in FIG. 7, a polysilicon film containing impurity ions is formed. Then, with the ordinary photolithography technology and etching technology, the lower layer wiring 2G including a planar shape in FIG. 5 is formed.

Figure 10:
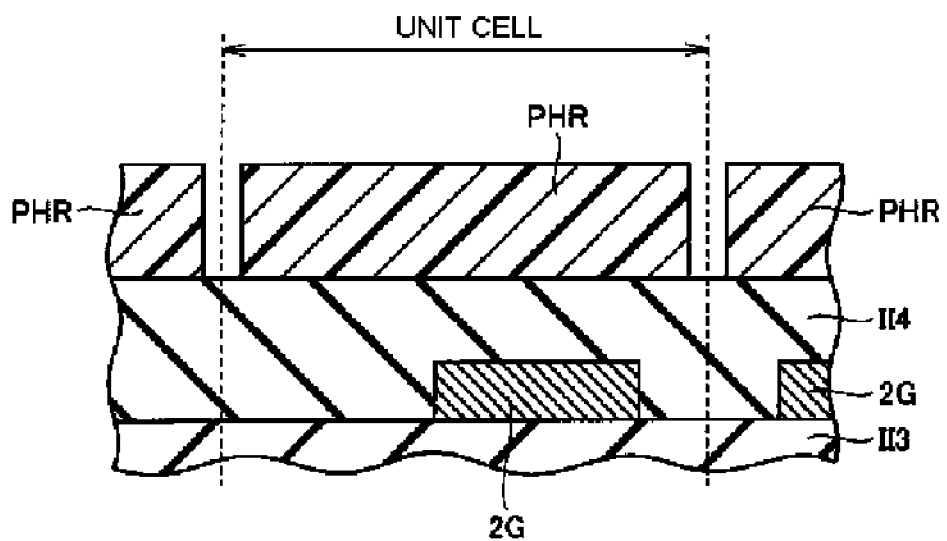
FIG. 10 is a schematic cross-sectional view showing the second step of the method of manufacturing the memory cell according to Embodiment 1 of the invention.

With reference to FIG. 10, the interlayer insulator (insulating film) II4 constituted by a silicon oxide film is formed using CVD (Chemical Vapor Deposition) to cover the upper surface of the interlayer insulator II3 and the lower layer wiring 2G. In the upper surface of the formed interlayer insulator II4, a step is formed to be higher than other regions right above the lower layer wiring 2G. For this reason, etch back or polishing by CMP (Chemical Mechanical Polishing) is performed on the interlayer insulator II4 so that the upper surface of the interlayer insulator II4 becomes approximately flat.

Figure 11:
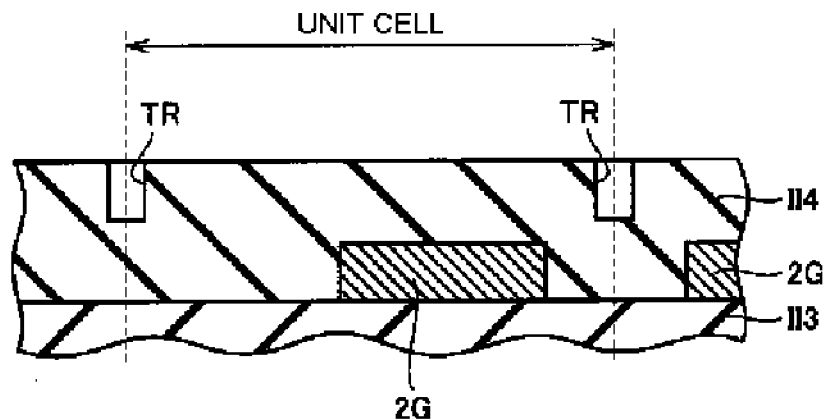
FIG. 11 is a schematic cross-sectional view showing the third step of the method of manufacturing the memory cell according to Embodiment 1 of the invention.

With reference to FIG. 10 and FIG. 11, the concave portion TR is formed in the surface of the interlayer insulator II4 with the ordinary photolithography technology and etching technology using a photoresist PHR. The bottom of the concave portion TR is preferably formed to be above the uppermost surface of the lower layer wiring 2G. Moreover, the bottom of the concave portion TR is preferably formed to contact the inside of the interlayer insulator II4 (so that the bottom of the concave portion TR is covered with an insulator). The concave portion TR is preferably formed at a location where it overlaps with the end of the unit cell in the plane view.

Figure 12:
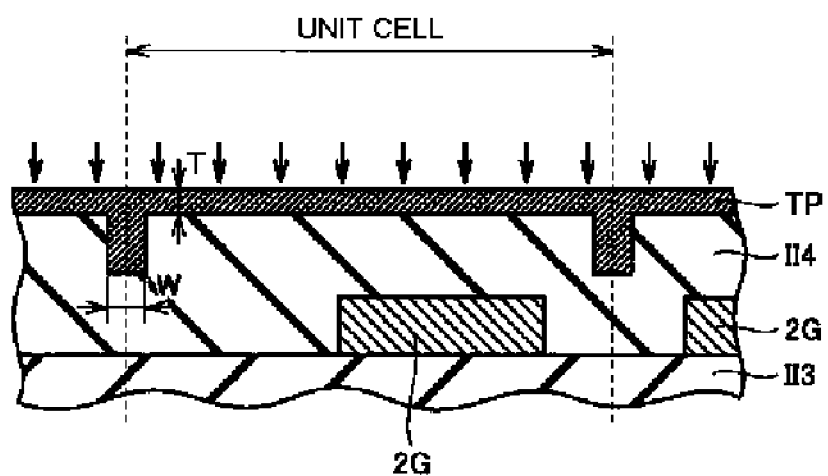
FIG. 12 is a schematic cross-sectional view showing the fourth step of the method of manufacturing the memory cell according to Embodiment 1 of the invention.

With reference to FIG. 12, the thin film TP (semiconductor layer) containing polysilicon is formed by CVD to cover the interlayer insulator II4 and the groove portion TR. If an opening width (in the horizontal direction of the view) W of the groove portion TR is less than twice a thickness T of the polysilicon layer TP, the polysilicon layer TP formed from above the interlayer insulator II4 and the concave portion TR fills the inside of the concave portion TR to form the polysilicon additional region TP1B constituting the polysilicon layer TP of FIG. 7. For this reason, the opening width W of the concave portion TR is preferably narrower than twice the thickness T of the polysilicon layer TP.

Subsequently, the ion of boron is preferably implanted to form a p-channel type TFT. With the implantation of these impurity ions, the threshold voltage in the channel region of the TFT formed is adjusted.

Figure 13:
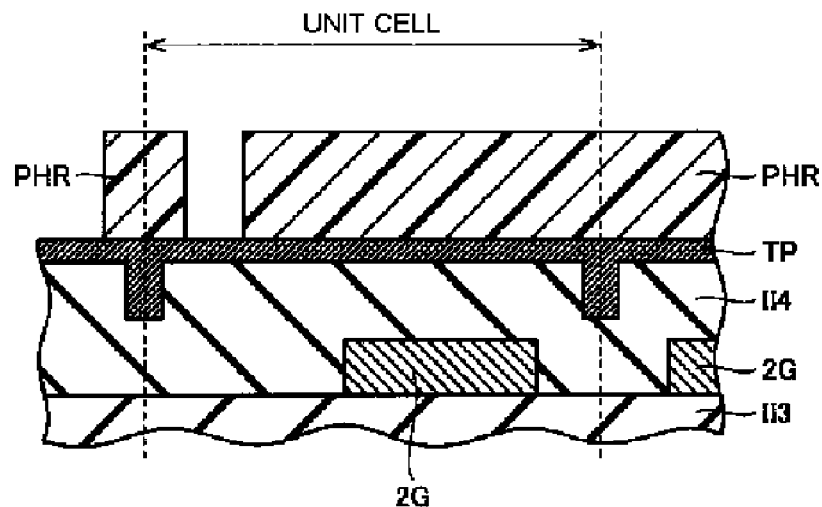
FIG. 13 is a schematic cross-sectional view showing the fifth step of the method of manufacturing the memory cell according to Embodiment 1 of the invention.
Figure 14:
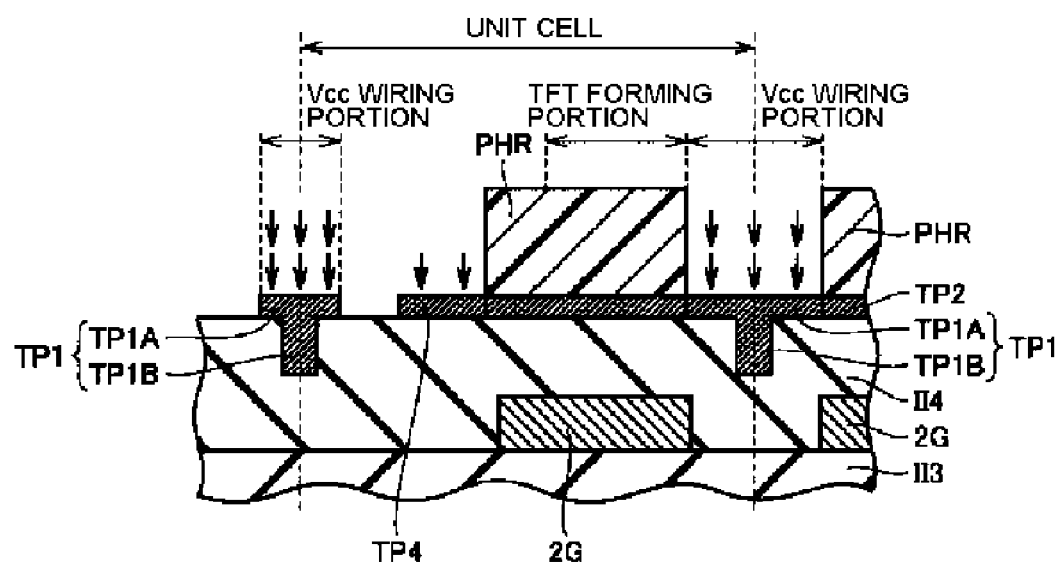
FIG. 14 is a schematic cross-sectional view showing the sixth step of the method of manufacturing the memory cell according to Embodiment 1 of the invention.

With reference to FIG. 13 and FIG. 14, with the ordinary photolithography technology and etching technology using the photoresist PHR, the polysilicon layer TP is patterned to have the planar shape in FIG. 6. A Vcc wiring portion in FIG. 14 indicates a region where the power supply wiring for supplying power to the source region of the formed TFT is formed, and a TFT forming portion indicates a region where particularly the gate electrode layer and the channel of the TFT formed are formed. In a region overlapping with the concave portion TR in the plane view among the polysilicon layers TPs, the same-layer polysilicon TP1A (the first portion) is formed, and thus in combination with the polysilicon additional region TP1B (second portion), a pair of polysilicon layers TP1 (power supply wiring/source region) is formed.

With reference to FIG. 14, with the ordinary ion implantation technology using the photoresist PHR as a mask, impurity ions are implanted into the region outside the TFT forming portion and into the same-layer polysilicon TP1A. With this processing, the electric resistance of the polysilicon layer TP1 as the Vcc wiring portion decreases. The ion of boron is preferably implanted to form the p-channel type TFT.

In the Vcc wiring portion, the impurity ions are simultaneously implanted into both the region where the same-layer polysilicon TP1A is formed and the region (inside the concave portion TR) where the polysilicon additional region TP1B is formed. Moreover, also in the polysilicon layer TP4, the impurity ions are implanted simultaneously with the Vcc wiring portion.

The concentration of the impurity implanted into the region where the same-layer polysilicon TP1A is formed and the concentration of the impurity implanted into the concave portion TR may be adjusted. Specifically, the same-layer polysilicon TP1A, the polysilicon layer TP4, and the same-layer polysilicon TP1A in the Vcc wiring portion on the right side of the view are formed in the same layer and the impurity ions are implanted simultaneously into these polysilicons.

If the impurity ions are excessively implanted into the polysilicon layer TP4 (drain region) and the same-layer polysilicon TP1A (source region), the impurity ions easily diffuse into the polysilicon layer TP2 which is the channel region. Therefore, the off-current of the TFT formed may increase. For this reason, the impurity ions are preferably not excessively implanted into the polysilicon layer TP4 and the same-layer polysilicon TP1A, and the impurity concentration is preferably set equal to or less than the reference concentration $C_0$ in FIG. 8. In contrast, in the concave portion TR formed under the polysilicon layer TP4 or the like, there is no limit to the impurity concentration in terms of the functionality of the polysilicon layer TP1 formed, unlike the same-layer polysilicon TP1A. Therefore, the impurity excessively implanted into the region, where the polysilicon layer TP1 is formed, is preferably diffused toward the polysilicon additional region TP1B. From the above, the impurity ions are preferably implanted into the polysilicon additional region TP1B so that the impurity concentration becomes higher than into the same-layer polysilicon TP1A. In the polysilicon additional region TP1B, the impurity concentration may be increased to such an extent that the impurity concentration in the same-layer polysilicon TP1A, into which the impurity ions are implanted simultaneously with the polysilicon additional region TP1B, does not exceed the reference concentration $C_0$.

Moreover, particularly depending on the depth of the concave portion TE, additional impurity ions may be implanted only into the Vcc wiring portion (concave portion TR). In this manner, the step of implanting impurity ions into the region where the polysilicon layer TP1 is formed may be performed multiple times. When additional impurity ions are implanted only into the Vcc wiring portion, a plurality of peaks of the impurity concentration with respect to the depth direction may be formed particularly in the polysilicon additional region TP1B formed.

Figure 15:
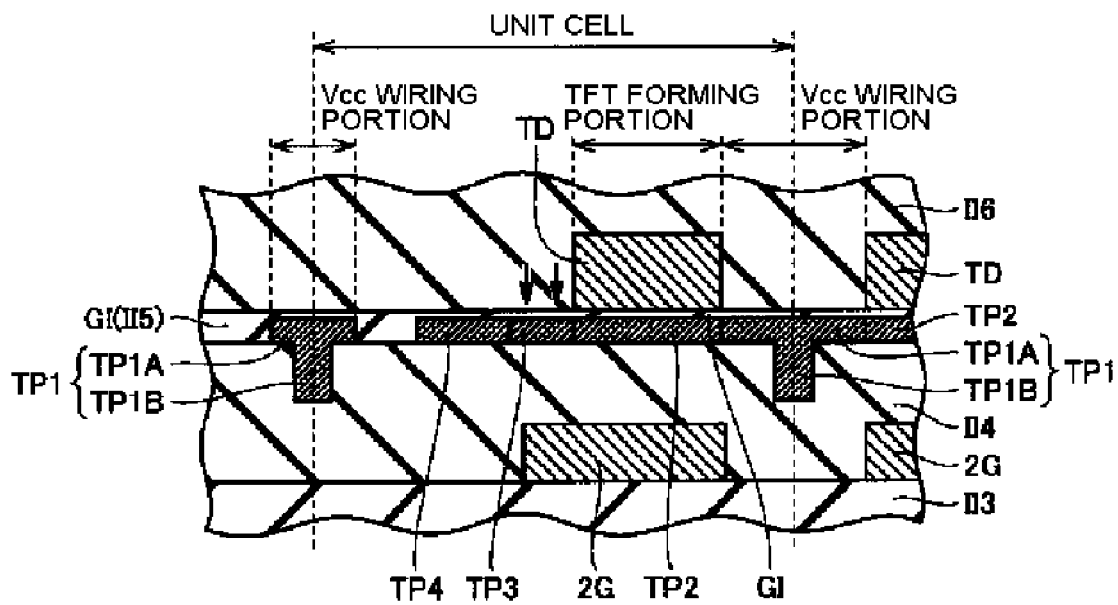
FIG. 15 is a schematic cross-sectional view showing the seventh step of the method of manufacturing the memory cell according to Embodiment 1 of the invention.

With reference to FIG. 15, after the photoresist PHR used in the step of FIG. 14 is removed, the gate insulating film GI constituted by a silicon oxide film is formed by CVD or thermal oxidation to cover the interlayer insulator II4 and the polysilicon layer TP. The gate insulating film GI is formed as the interlayer insulator II5. Next, the gate electrode layer TD of the TFT is formed so as to cover the gate insulating film GI (interlayer insulator II5). With the ordinary photolithography technology and etching technology, the gate electrode layer TD is formed in a region where it overlaps with the polysilicon layer TP2 (channel region) in the plane view.

Although not shown in FIG. 15, the data node contact DB for forming the cross-coupled circuit of the SRAM in FIG. 2 and FIG. 6 is preferably formed before the gate electrode layer TD is formed. After the groove portion for forming the data node contact DB is formed with the ordinary photolithography technology and etching technology, the groove portion is filled with the polysilicon containing impurity ions for forming the gate electrode layer TD. In this manner, the data node contact DB is formed.

Subsequently, preferably, with the pattern of the formed gate electrode layer TD as a mask, impurity ions are additionally implanted into the polysilicon layer TP3. Because the impurity ions are additionally implanted into the polysilicon layer TP3 and the impurity ions in the polysilicon layer TP3 becomes higher than in the polysilicon layer TP2, the electric field in the drain region of the TFT formed can be relaxed. The impurity ions are preferably implanted so that the impurity concentration in the polysilicon layer TP3 may become lower than in the polysilicon layer TP1 and in the polysilicon layer TP4. With this processing, each region of the polysilicon layer TP is formed so that the impurity concentration of the polysilicon layer TP3 becomes lower than the polysilicon layers TP1 and TP4 and the impurity concentration of the polysilicon layer TP2 becomes lower than the polysilicon layer TP3. In this manner, the increase in the off-current of the TFT due to the impurity ions additionally implanted into the polysilicon layer TP3 can be restrained.

With the respective steps described above, in the TFT forming portion, a TFT (inside the rectangular dotted line of FIG. 7) is formed which is constituted by a stacked gate electrode in which the gate insulating film GI and the gate electrode layer TD are stacked in this order; the source region as the polysilicon layer TP1 formed on the right side of the gate electrode layer TD in FIG. 15; and the drain region as the polysilicon layer TP4 formed on the left side of the gate electrode layer TD in FIG. 15. In the step of FIG. 15, while a pattern of the gate electrode layer TD is formed also on the left side of the gate electrode layer TD (see FIG. 7), the illustration of this is omitted in FIG. 15.

Figure 16:
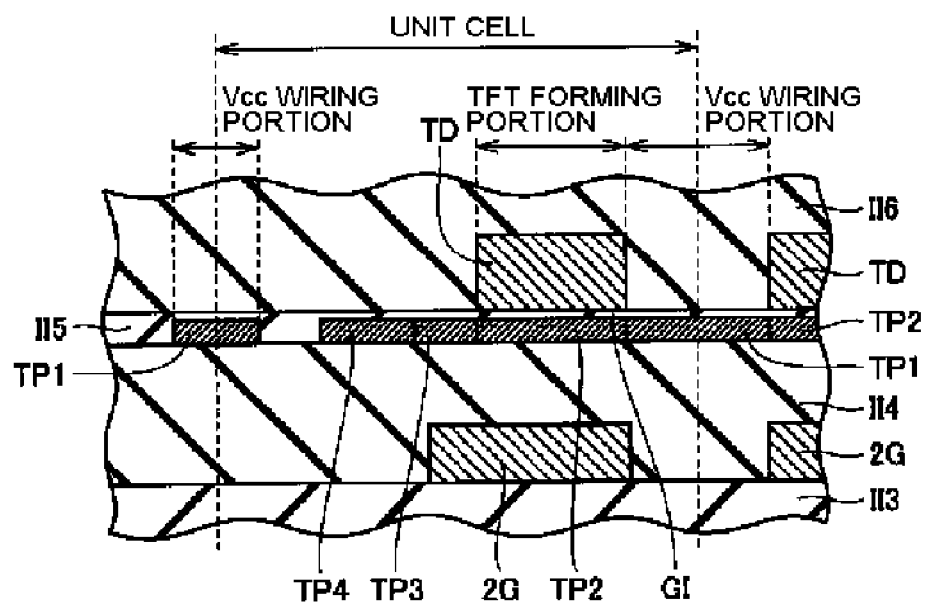
FIG. 16 is a schematic cross-sectional view showing an aspect corresponding to FIG. 15 in Embodiment 1, of a memory cell as a comparison of Embodiment 1 of the invention.

Next, the operational effect of the embodiment will be described with reference to FIG. 16 to FIG. 20. FIG. 16 shows, in a comparison, the configuration of a TFT in the same region as FIG. 7 (FIG. 15) in the embodiment. With reference to FIG. 16, FIG. 16 differs from FIG. 15 in that a pair of polysilicon layers TP1 corresponding to the power supply wiring (source region) does not have the polysilicon additional region TP1B, but is constituted by only a region corresponding to the same-layer polysilicon TP1A in FIG.

15. FIG. 16 is otherwise the same as FIG. 15. Therefore, in FIG. 16, the same element as FIG. 15 is marked with the same reference numeral and the description is not repeated.

Figure 17:
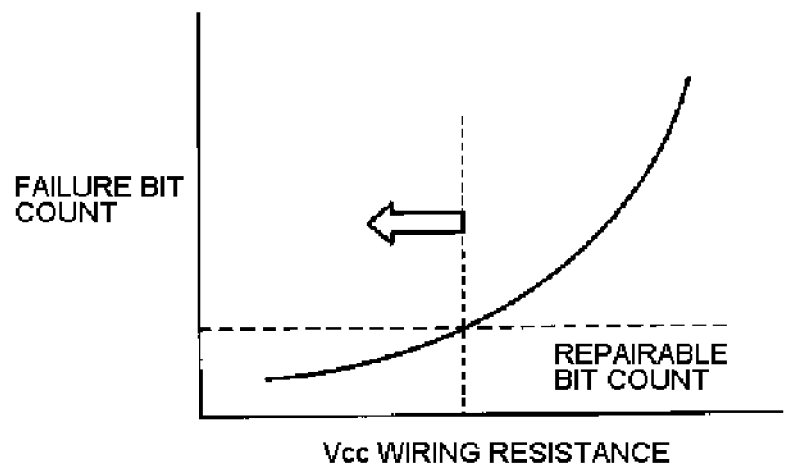
FIG. 17 is a graph showing a relationship between a Vcc wiring resistance and a failure bit count in Embodiment 1 of the invention.

The horizontal axis of a graph in FIG. 17 indicates the electric resistance of the Vcc wiring (power supply wiring TP1) with respect to the TFT, and the vertical axis indicates a failure bit count (a ratio at which a failure bit occurs in a plurality of memory cells) of the memory cell of the TFT.

In the TFT that is formed in the semiconductor layer over the semiconductor substrate SUB as with the comparative example, as compared with the transistor formed in the major surface of the semiconductor substrate SUB, the characteristics of each transistor constituting the memory cell become unstable and the variation in the above-mentioned characteristic and the variation in the current flowing into each memory cell increases.

With reference to FIG. 17, the unstable characteristic becomes conspicuous in particular when the electric resistance of the Vcc wiring for supplying power to the TFT increases. If the electric resistance of the Vcc wiring increases, the voltage drop in the Vcc wiring portion increases. Thus, the variation in the voltage supplied to the memory cell increases and then the generation ratio of the memory cell (bit) having a defect in characteristics increases.

In a general-purpose SRAM, a failure bit can be repaired using a redundant circuit. However, because the number of failure bits that can be repaired (a repairable bit count) has a limit, if the failure bit count exceeds the repairable bit count, the general-purpose SRAM fails as the product. Therefore, the Vcc wiring resistance needs to be reduced so that the failure bit count is equal to or less than the repairable bit count. To reduce the Vcc wiring resistance, the concentration of the impurity ions implanted into the polysilicon layer TP1 constituting the Vcc wiring portion is preferably increased.

Figure 18:
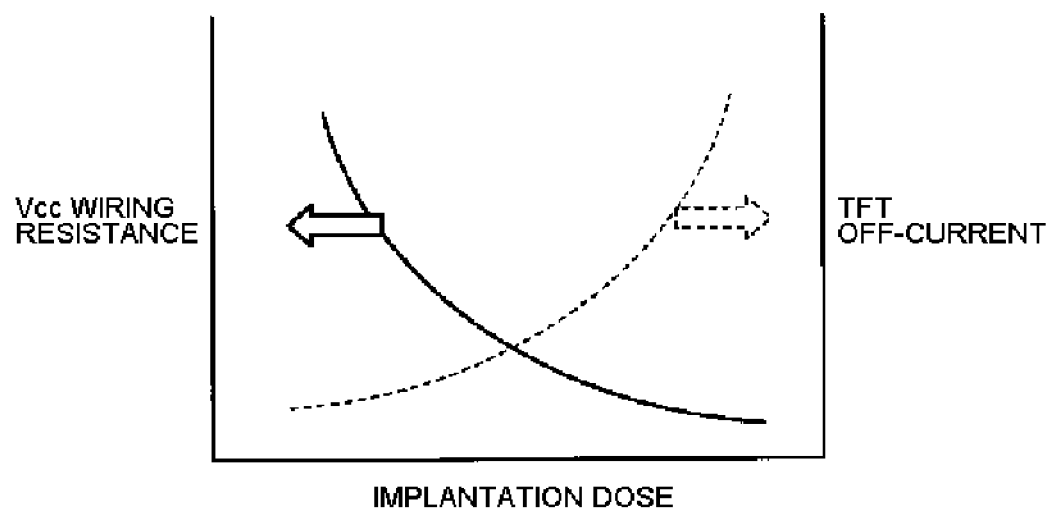
FIG. 18 is a graph showing a relationship between the implantation doses of impurity ions, the Vcc wiring resistance, and a TFT off-current in Embodiment 1 of the invention.

The horizontal axis of a graph in FIG. 18 indicates the concentration (implantation dose) of the impurity ions implanted into the polysilicon layer, and the vertical axis indicates the electric resistance of the Vcc wiring (Vcc wiring resistance) in the data of a solid line in the figure and the off-current of the formed TFT in the data of a dotted line in the figure, respectively. With reference to FIG. 18, if the implantation dose of the impurity ions in the Vcc wiring portion is increased, the Vcc wiring resistance decreases but the TFT off-current increases. To reduce the TFT off-current, the implantation dose of the impurity ions in the Vcc wiring portion is preferably reduced, but in this case the Vcc wiring resistance increases. As described above, a reduction in the Vcc wiring resistance and a decrease in the TFT off-current are in a trade-off relationship. Accordingly, when the polysilicon layer TP1 in the Vcc wiring portion has only the same layer as the polysilicon layers TP2 to TP4 as shown in FIG. 16, it is difficult to reduce the Vcc wiring resistance and decrease the TFT off-current at the same time.

Then, as with the embodiment, the polysilicon layer TP1 in the Vcc wiring portion preferably has a configuration, in which the same-layer polysilicon TP1A formed from the same layer as the polysilicon layers TP2 to TP4 is integrated with the polysilicon additional region TP1B formed from a (lower) layer different from (under) the polysilicon layers TP2 to TP4. In this manner, the cross-sectional area of the power supply wiring is a sum of that of the same-layer polysilicon TP1A and that of the polysilicon additional region TP1B. As compared with the case where the polysilicon layer TP1 as the power supply wiring has only the same-layer polysilicon TP1A as with FIG. 16, the cross-sectional area of the polysilicon layer TP1 increases.

Figure 19A:
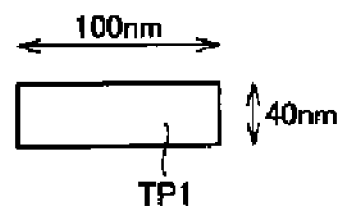
FIG. 19A is a schematic cross-sectional view showing the dimensions of a polysilicon layer as the power supply wiring in the comparison of the invention.

To verify the content, with reference to FIG. 19A, it is assumed that the cross section of the polysilicon layer TP1 in the comparison in FIG. 16 has a rectangular shape TP1A with the length of 40 nm and the width of 100 nm. Moreover, with reference to FIG. 20A, it is assumed that the polysilicon layer TP1 in the embodiment in FIG. 15 has a cross section of the same rectangular shape TP1A as the comparison in FIG. 16 integrated with the polysilicon additional region TP1B having a cross section with the length of 100 nm and the width of 40 nm.

Figure 19B:
FIG. 19B is an equivalent circuit of the polysilicon layer in FIG. 19A.

With reference to FIG. 19B, when a plurality of (three or like) polysilicon layers TP1 of the comparison in FIG. 19A is spaced from each other, this is equivalent to a circuit having three electric resistors, each of which is an electric resistor (resistor H) the polysilicon layer TP1 has, connected in series. With reference to FIG. 20B, when a plurality of (three or like) polysilicon layers TP1 in the embodiment in FIG. 20A is spaced from each other, this is equivalent to a circuit having three parallel circuits connected in series, the each parallel circuit being constituted by the electric resistor (resistor H) which the polysilicon layer TP1A has and an electric resistor (resistor L) which the polysilicon layer TP1B has.

Figure 20A:
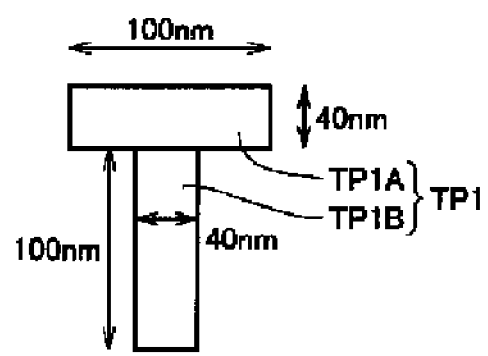
FIG. 20A is a schematic cross-sectional view showing the dimensions of a polysilicon layer as the power supply wiring in Embodiment 1 of the invention.
Figure 20B:
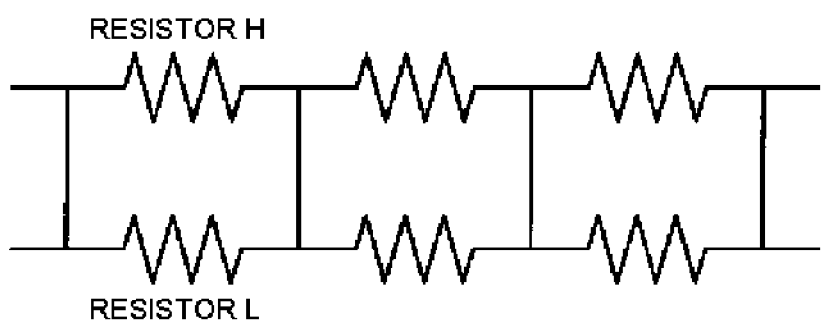
FIG. 20B is an equivalent circuit of the polysilicon layer in FIG. 20A.

Comparison between FIG. 19A and FIG. 20A shows that the polysilicon layer TP1 in the embodiment has twice the cross-sectional area of the polysilicon layer TP1 of the comparison. Moreover, if the impurity concentration of the polysilicon layer TP1A (the polysilicon layer TP1 in FIG. 19A) is approximately equal to the impurity concentration of the polysilicon layer TP1B, the electric resistance which the resistor H has is approximately equal to the electric resistance which the resistor L has. The electric resistance of the polysilicon layer TP1 in FIG. 20A is approximately a half the electric resistance of the polysilicon layer TP1 in FIG. 19A.

By providing the polysilicon additional region TP1B in the polysilicon layer TP1 as with the embodiment, even if the value of the impurity concentration (electric resistance) in the polysilicon layer TP1A is equal to that of the polysilicon layer TP1 of the comparison, the electric resistance of the polysilicon layer TP1 can be approximately halved. Accordingly, in the embodiment, by adjusting the concentration of the impurity ions in the same-layer polysilicon TP1A so as not to be excessive, as with the polysilicon layers TP2 to TP4, the electric resistance of the entire polysilicon layer TP1 can be reduced while suppressing the increase in the off-current of the TFT. In the embodiment, the electrical characteristics of the memory cell can be further stabilized by reducing the Vcc wiring resistance while restraining the increase in the off-current of the TFT. Accordingly, the number of generation of failure bits of the memory cell including the TFT can be further reduced.

Moreover, by providing the polysilicon additional region TP1B in the polysilicon layer TP1, as with the embodiment, the absolute amount of the impurity ions, which the polysilicon layer TP1 can include, can be increased without increasing the impurity concentration in the polysilicon layer TP1.

In the embodiment, some of the impurity ions implanted into the same-layer polysilicon TP1A of the polysilicon layer TP1 are caused to diffuse (move) into the polysilicon additional region TP1B, and thus the electric resistance of the polysilicon layer TP1 can be reduced without excessively increasing the impurity concentration in the same-layer polysilicon TP1A. The impurity in the same-layer polysilicon TP1A of the polysilicon layer TP1 as the source region of the TFT is reduced, and thus the diffusion of the impurity ions into the polysilicon layers TP2 to TP4 can be restrained. As a result, the increase in the off-current of the TFT can be restrained.

As shown in FIG. 14, the impurity ions are simultaneously implanted both into the polysilicon layer TP4 formed as the drain region of the TFT and into the polysilicon layer TP1 as the source region, and thus the impurity concentration in the polysilicon layer TP1 is controlled similarly to and simultaneously with the polysilicon layer TP4. Therefore, it is possible to reliably restrain the phenomenon of inducing the increase in the off-current of the TFT formed, such as the phenomenon in which the impurity concentration in the polysilicon layer TP4 becomes extremely high as compared with the polysilicon layer TP1.

To increase the above effect, the impurity concentration in the polysilicon additional region TP1B is preferably higher than the impurity concentration in the same-layer polysilicon TP1A. The step of implanting the impurity is preferably performed multiple times to finely adjust the implantation dose of the impurity ions in this manner, and the impurity ions in the same-layer polysilicon TP1A can be efficiently caused to diffuse (move) into the polysilicon additional region TP1B. Accordingly, in the polysilicon additional region TP1B, the impurity concentration can be set higher than in the polysilicon TP1A.

However, as long as the impurity concentration in the polysilicon layer TP1A and in the polysilicon layers TP2 to TP4 is not excessively high, the impurity concentration of the polysilicon layer TP1A may be higher than the polysilicon layer TP1B, or in some areas of the polysilicon layer TP1B, the impurity concentration may be lower than in some areas of the polysilicon layer TP1A.

Other than this, in the embodiment, by reducing the electric resistance of the Vcc wiring, the number of the Vcc wirings to be formed (piled) can be reduced. As a result, the area in the plane view of the entire memory cell and of the entire semiconductor device can be reduced. Accordingly, by reducing the electric resistance of the Vcc wiring, the size of the semiconductor device can be reduced.

Furthermore, in the embodiment, the polysilicon layer TP1 combines a function as the power supply wiring and a function as the source wiring of the TFT. Therefore, by reducing the electric resistance in the source region of the TFT, the electrical characteristics of the TFT can be further improved.

Embodiment 2

Figure 21:
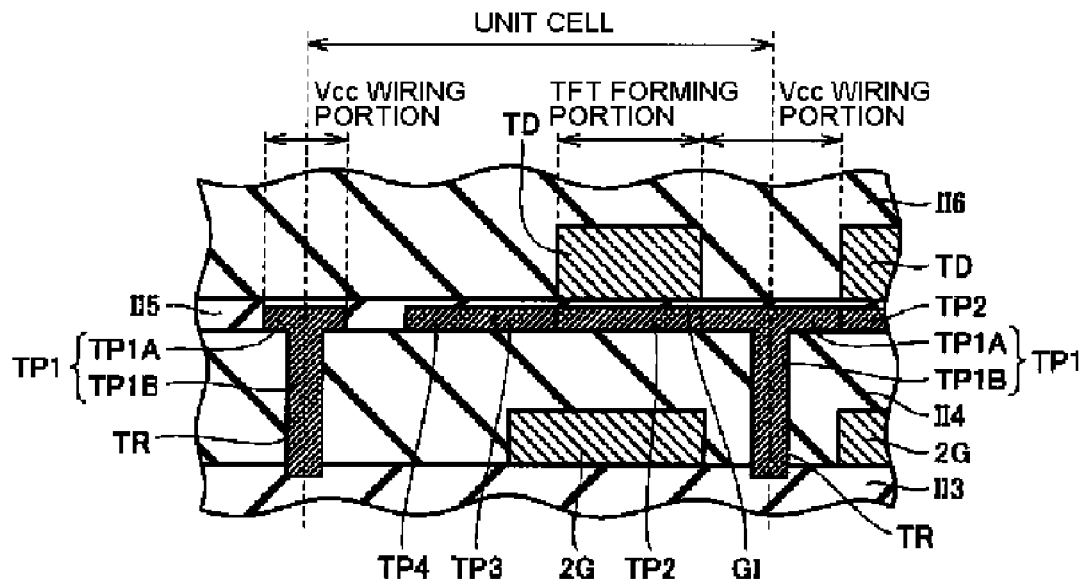
FIG. 21 is a schematic cross-sectional view showing an aspect in the same region as the aspect in FIG. 15 in Embodiment 1, of a memory cell according to Embodiment 2 of the invention.

The embodiment differs from Embodiment 1 in the configuration of the polysilicon layer TP1. With reference to FIG. 21, the configuration of the region, in which the TFT is formed, surrounded by the rectangular dotted line in FIG. 7, in the embodiment is described.

With reference to FIG. 21, in the embodiment, the bottom of the polysilicon additional region TP1B (the concave portion forming the polysilicon additional region TP1B) constituting the polysilicon layer TP1 is under the lowermost surface of the lower layer wiring 2G.

In the embodiment, in a region overlapping with the polysilicon additional region TP1B in the plane view, the lower layer wiring 2G is not formed. Therefore, the polysilicon additional region TP1B (the concave portion forming the polysilicon additional region TP1B) reaching under the lowermost surface of the lower layer wiring 2G extends through the interlayer insulator II4 and reaches the interlayer insulator II3. The bottom of the polysilicon additional region TP1B (the concave portion forming the polysilicon additional region TP1B) is covered with the interlayer insulator II3.

A method of manufacturing the region in which the TFT in FIG. 21 is formed differs from Embodiment 1 only in the depth at which the concave portion TR of the polysilicon additional region TP1B is formed, but is otherwise the same as the manufacturing method in Embodiment 1.

The configuration of the embodiment in FIG. 21 differs from that of Embodiment 1 in FIG. 7 (FIG. 15) in the above-described point and is otherwise the same as the configuration of Embodiment 1 in FIG. 7 (FIG. 15), and thus the same element is marked with the same reference numeral and the description is not repeated.

Next, the operational effects of the embodiment are described. The embodiment has the following effects in addition to the operational effect in Embodiment 1.

In the embodiment, because the polysilicon additional region TP1B is formed deep as compared with Embodiment 1, the cross-sectional area of the polysilicon additional region TP1B increases as compared with Embodiment 1. Accordingly, the cross-sectional area of the polysilicon layer TP1 further increases, and thus the electric resistance of the polysilicon layer TP1 can be further reduced.

Moreover, in the embodiment, the absolute amount of the impurity ions the entire polysilicon layer TP1 can include can be increased without increasing the concentration of the impurities implanted into the polysilicon layer TP1. Also, in the embodiment, the electric resistance of the polysilicon layer TP1 can be reduced further than Embodiment 1.

Furthermore, in the embodiment, because the polysilicon additional region TP1B is formed deep, the distance between the vicinity of the bottom of the polysilicon additional region TP1B and the channel region of the TFT increases further. Therefore, by controlling the implanting condition of the impurity ions to the relevant region so that the concentration of the impurity ions implanted in the vicinity of the bottom of the polysilicon additional region TP1B becomes extremely high, the semiconductor device including the TFT can be easily provided in which the electric resistance in the Vcc wiring is further reduced while suppressing the increase in the off-current.

Embodiment 2 of the invention differs from Embodiment only in the above-described points. With regard to Embodiment 2 of the invention, all the configuration, the conditions, the procedure, the effects, and the like not described are based on Embodiment 1 of the invention.

Embodiment 3

Figure 22:
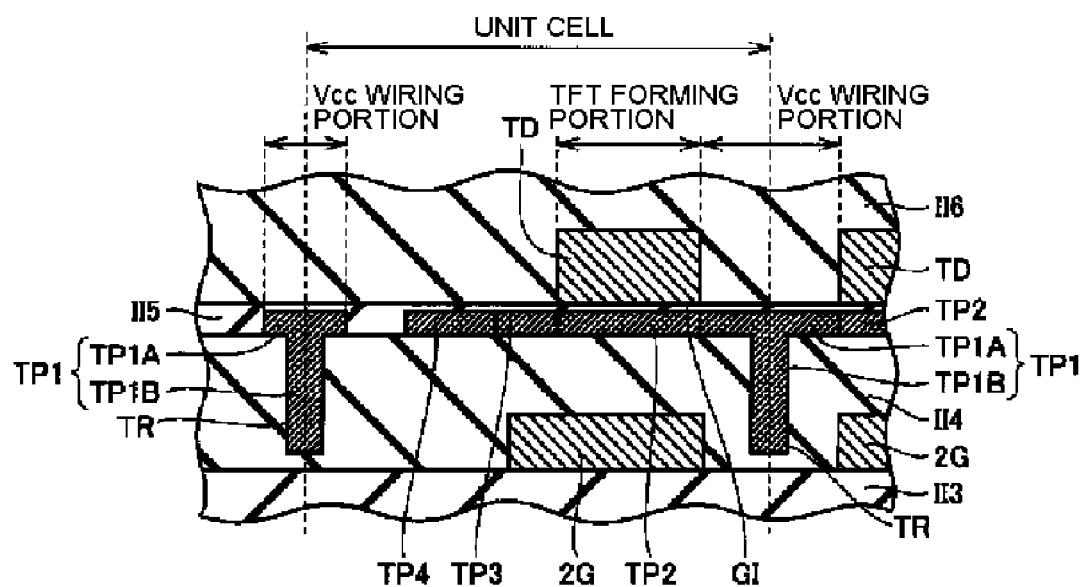
FIG. 22 is a schematic cross-sectional view showing an aspect in the same region as the aspect in FIG. 15 in Embodiment 1, of a memory cell according to Embodiment 3 of the invention.

The embodiment differs from Embodiment 1 in the configuration of the polysilicon layer TP1. With reference to FIG. 22, the configuration of the region, in which the TFT is formed, surrounded by the rectangular dotted line in FIG. 7, in the embodiment is described.

With reference to FIG. 22, in the embodiment, the bottom of the polysilicon additional region TP1B (the concave portion forming the polysilicon additional region TP1B) constituting the polysilicon layer TP1 is under the uppermost surface of the lower layer wiring 2G and above the lowermost surface of the lower layer wiring 2G.

In the embodiment, in a region overlapping with the polysilicon additional region TP1B in the plane view, the lower layer wiring 2G is not formed. The bottom of the polysilicon additional region TP1B (the concave portion forming the polysilicon additional region TP1B) reaching a depth under the uppermost surface of the lower layer wiring 2G and above the lowermost surface of the lower layer wiring 2G is covered with the interlayer insulator II4.

A method of manufacturing the region in which the TFT in FIG. 22 is formed differs from Embodiment 1 only in the depth at which the concave portion TR of the polysilicon additional region TP1B is formed, but is otherwise the same as the manufacturing method in Embodiment 1.

The configuration of the embodiment in FIG. 22 differs from that of Embodiment 1 in FIG. 7 (FIG. 15) in the above-mentioned point and is otherwise the same as the configuration of Embodiment 1 in FIG. 7 (FIG. 15), and thus the same element is marked with the same reference numeral and the description is not repeated.

Next, the operational effects in the embodiment is described. The embodiment has the following effects in addition to the operational effect of Embodiment 1.

In the embodiment, because the polysilicon additional region TP1B is formed deep as compared with Embodiment 1, as with Embodiment 2, the electric resistance of the polysilicon layer TP1 can be reduced further than that in Embodiment 1.

Furthermore, in the embodiment, it is possible to restrain the phenomenon in which the impurity ions implanted into the polysilicon additional region TP1B affect a wiring in a lower layer. Specifically, into the polysilicon additional region TP1B, p-type impurity ions for forming the source region of the p-channel type TFT are implanted. In contrast to this, in the further lower layer, when an n-channel transistor is formed, a wiring having an n-type impurity ion implanted therein and the like are formed.

In implanting p-type impurity ions into the concave portion TR for forming the polysilicon additional region TP1B, if the implantation energy is very high, the impurity ions may pass through the bottom of the concave portion TR and enter the n-type impurity ion implantation region in a lower layer. If p-type impurity ions are implanted into the n-type impurity region, the electrical characteristics of the n-type impurity region may be greatly affected by the decrease in the effective impurity concentration and the like. In the case where the lower layer wiring 2G is formed by polysilicon containing an n type impurity, if a p-type impurity is implanted here, the increase in the wiring resistance of the lower layer wiring 2G is caused. This phenomenon, such as one in Embodiment 2, easily occurs particularly when the polysilicon additional region TP1B is very deep and reaches a layer under the interlayer insulator II4.

Then, as with the embodiment, while the polysilicon additional region TP1B is formed deeper than Embodiment 1, it is formed at a depth to the extent that the polysilicon additional region TP1B does not reach the lowermost surface of the interlayer insulator II4 (approximately at a depth under the uppermost surface of the lower layer wiring 2G and above the lowermost surface of the lower layer wiring 2G). In this manner, as compared with the polysilicon additional region TP1B in Embodiment 2, the distance from the bottom of the polysilicon additional region TP1B to the n-channel impurity region in a lower layer can be increased. Therefore, in the embodiment, as compared with Embodiment 3, the possibility of occurrence of the problem of mixing of different types of impurity ions as described can be reduced.

Embodiment 3 according to the invention differs from Embodiment 1 only in the above-described points. With regard to Embodiment 3 of the invention, all the configuration, the conditions, the procedure, the effects, and the like not described are based on Embodiment 1.

Embodiment 4

Figure 23:
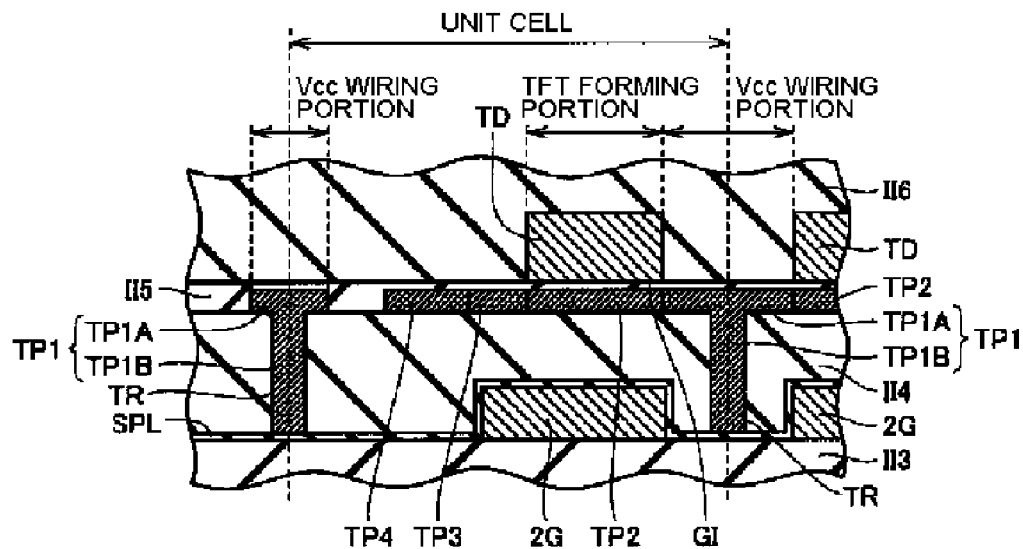
FIG. 23 is a schematic cross-sectional view showing an aspect in the same region as the aspect in FIG. 15 in Embodiment 1, of a memory cell according to Embodiment 4 of the invention.

The embodiment differs from Embodiment 1 in the configuration of the polysilicon layer TP1 and that of the underlayer of the power supply wiring. With reference to FIG. 23, the configuration of the region, in which the TFT is formed, surrounded by the rectangular dotted line in FIG. 7, in the embodiment is described.

With reference to FIG. 23, in the embodiment, a stopper film SPL, which covers the lower layer wiring 2G and the upper surface of the interlayer insulator II3 and which is as a thin film located under the interlayer insulator II4, is further provided. Then, the polysilicon additional region TP1B (the concave portion TR) extending downward from the same-layer polysilicon TP1A is formed so as to extend to the stopper film SPL. Accordingly, the bottom of the polysilicon additional region TP1B in the embodiment is formed above the bottom of the polysilicon additional region TP1B in Embodiment 2 and under the bottom of the polysilicon additional region TP1B in Embodiments 1, 3.

The stopper film SPL is preferably constituted by an insulating material having an extremely different etching rate with respect to the interlayer insulator II4. When the interlayer insulator II4 is constituted by a silicon oxide film, the stopper film SPL is preferably constituted by a silicon nitride film.

In either of FIG. 21 to FIG. 23, as with FIG. 15, the illustration of the pattern corresponding to the gate electrode layer TD on the left side in FIG. 7 is omitted.

The configuration of the embodiment in FIG. 23 differs from that of Embodiment 1 shown in FIG. 7 (FIG. 15) in the above-described point, and is otherwise the same as the configuration of Embodiment 1 in FIG. 7 (FIG. 15), and thus the same element is marked with the same reference numeral and the description is not repeated.

Next, a method of manufacturing the region, in which the TFT in FIG. 23 is formed, is described with reference to FIG. 24 to FIG. 29.

Figure 24:
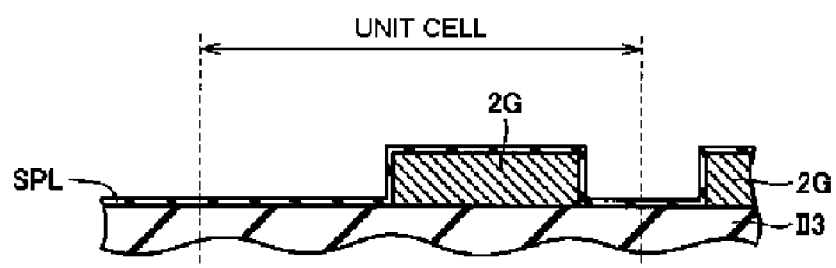
FIG. 24 is a schematic cross-sectional view showing the first step of a method of manufacturing the memory cell according to Embodiment 4 of the invention.

With reference to FIG. 24, as with FIG. 9, after the interlayer insulator II3 and the lower layer wiring 2G are formed, the stopper film SPL constituted by a silicon nitride film is formed using CVD to cover the upper surface of the interlayer insulator II3 and the lower layer wiring 2G.

Figure 25:
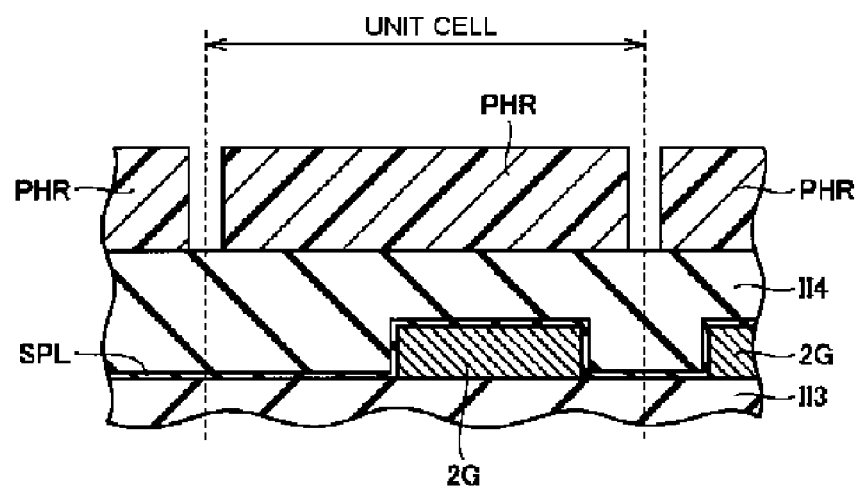
FIG. 25 is a schematic cross-sectional view showing the second step of the method of manufacturing the memory cell according to Embodiment 4 of the invention.

With reference to FIG. 25, as with FIG. 10, the interlayer insulator II4 is formed and the upper surface is planarized by etch back or polishing by CMP.

Figure 26:
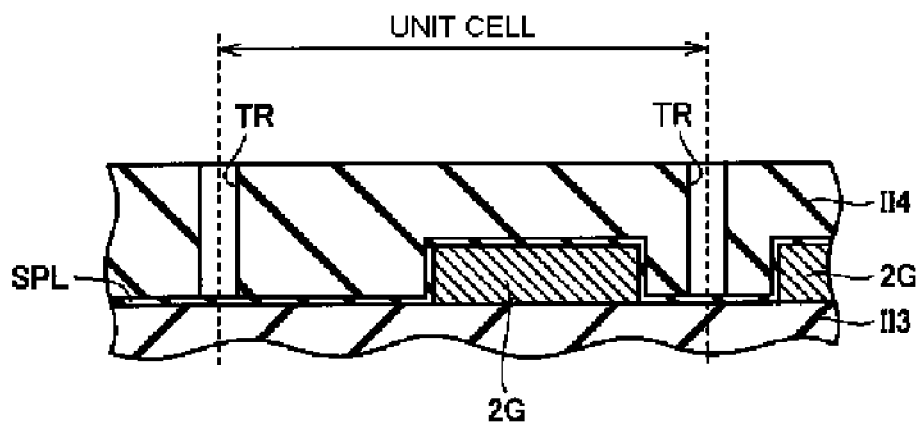
FIG. 26 is a schematic cross-sectional view showing the third step of the method of manufacturing the memory cell according to Embodiment 4 of the invention.

With reference to FIG. 25 and FIG. 26, next, with the ordinary photolithography technology and etching technology using the photoresist PHR, the concave portion TR is formed in the surface of the interlayer insulator II4 as with FIG. 11. The concave portion TR is preferably formed so that the bottom of the concave portion TR reaches the surface of the stopper film SPL. Because the etching rate of the stopper film SPL is extremely different from the etching rate of the interlayer insulator II4, the etching for forming the concave portion TR stops when it has reached the stopper film SPL. For this reason, the etching can be precisely controlled so that the depth of the concave portion TR is the distance from the surface of the interlayer insulator II4 to the surface of the stopper film SPL.

Figure 27:
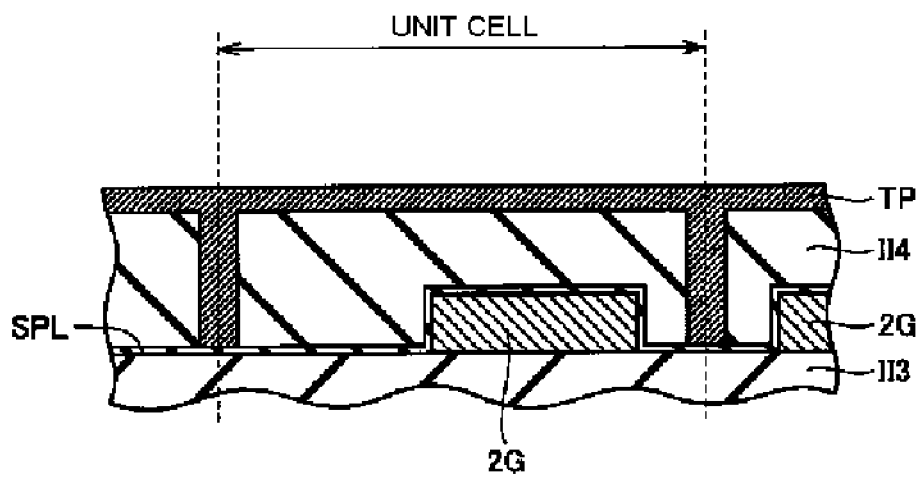
FIG. 27 is a schematic cross-sectional view showing the fourth step of the method of manufacturing the memory cell according to Embodiment 4 of the invention.

With reference to FIG. 27, the thin film TP is formed as with FIG. 12, and subsequently impurity ions are implanted into the thin film TP with the ordinary ion implantation technology.

Figure 28:
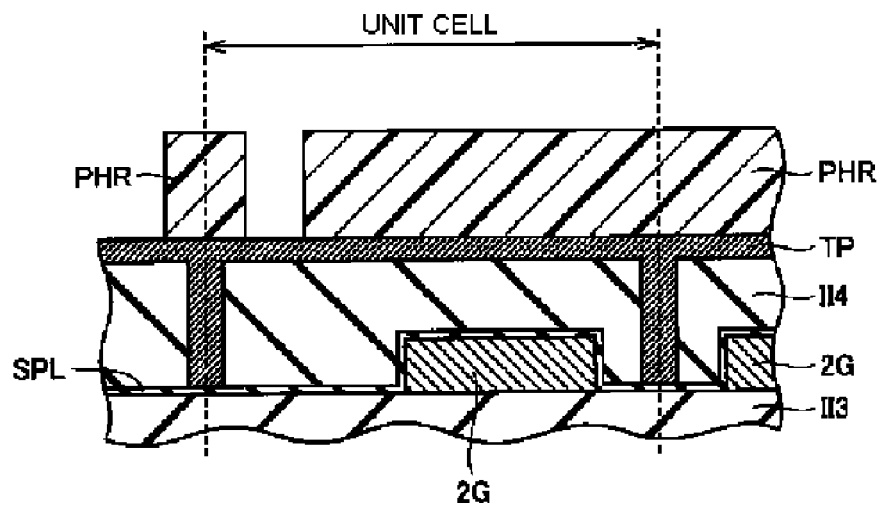
FIG. 28 is a schematic cross-sectional view showing the fifth step of the method of manufacturing the memory cell according to Embodiment 4 of the invention.
Figure 29:
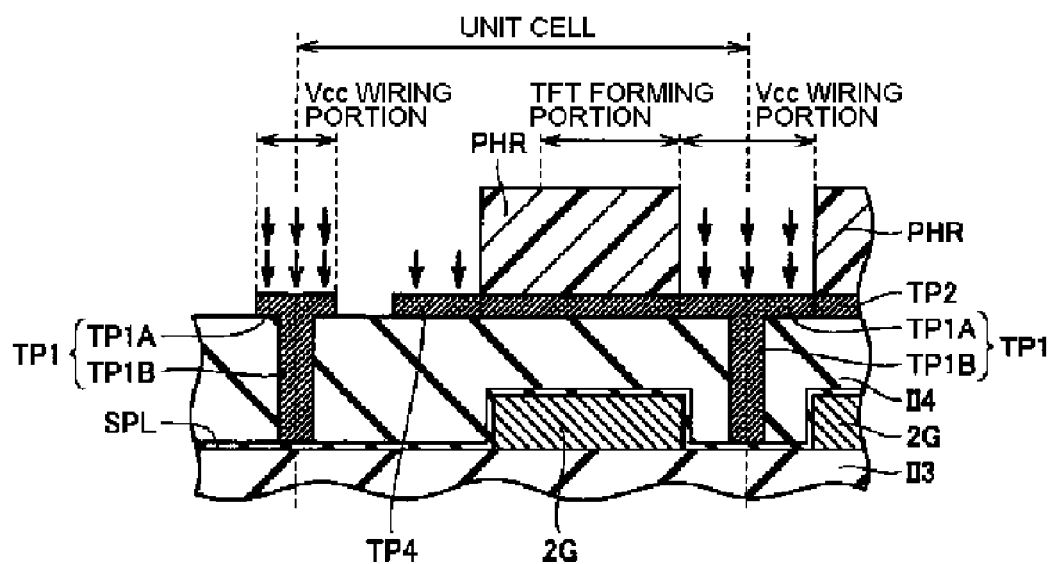
FIG. 29 is a schematic cross-sectional view showing the sixth step of the method of manufacturing the memory cell according to Embodiment 4 of the invention.

With reference to FIG. 28 and FIG. 29, the patterning of the polysilicon layer TP and the implantation of impurity ions are performed as with FIG. 13 and FIG. 14. Subsequently, the gate insulating film GI and the gate electrode layer TD are formed as with FIG. 15 to form the TFT having the aspect in FIG. 23.

Next, the operational effects of the embodiment are described. The embodiment has the following effects in addition to the operational effect of Embodiment 1.

In the embodiment, the bottom of the polysilicon additional region TP1B is formed over the stopper film SPL. Therefore, the depth of the polysilicon additional region TP1B is determined only by the thickness of the interlayer insulator II4. The variation in the depth of the polysilicon additional region TP1B is restrained, and thus the variation in the electric resistance of the polysilicon layer TP1 can be reduced. Therefore, the electrical characteristics of the memory cell can be stabilized further.

Embodiment 4 of the invention differs from Embodiment 1 only in the above-described points. With regard to of Embodiment 4 of the invention, all the configuration, the conditions, the procedure, the effects, and the like not described are based on those of Embodiment 1 of the invention.

Although the Advanced SRAM has been described, the invention may be applied not only to SRAM but to a liquid crystal display with a TFT.

The embodiments disclosed should be considered to be illustrative only in every respect but not restrictive. The scope of the invention is indicated not by the aforementioned descriptions but by the scope of the appended claims. The scope of the invention is intended to include the meaning equivalent to the appended claims and all the modifications within the scope of the inventions.

Particularly, the invention is advantageously applied to a semiconductor device having a semiconductor layer formed over the surface of an insulating film, and to the method of manufacturing the same.

What is claimed is:

1. A semiconductor device, comprising:
    an insulating film with a surface;
    a semiconductor layer which is formed over the surface of the insulating film, and which includes a channel region and a pair of source/drain regions sandwiching the channel region; and
    a power supply wiring for supplying power to the source region,
    wherein a concave portion is formed in the surface of the insulating film,
    wherein the power supply wiring includes a layer formed from the same layer as the semiconductor layer, and has a first portion formed over the surface of the insulating film and a second portion formed in the concave portion, and
    wherein a bottom of the second portion is covered with an insulator.

2. The semiconductor device according to claim 1, further comprising a lower layer wiring formed in a lower layer of the power supply wiring,
    wherein the bottom of the second portion is above an uppermost surface of the lower layer wiring.

3. The semiconductor device according to claim 1, further comprising a lower layer wiring formed in a lower layer of the power supply wiring,
    wherein the bottom of the second portion is located under a lowermost surface of the lower layer wiring.

4. The semiconductor device according to claim 1, further comprising a lower layer wiring formed in a lower layer of the power supply wiring,
    wherein the bottom of the second portion is arranged under an uppermost surface of the lower layer wiring and above a lowermost surface of the lower layer wiring.

5. The semiconductor device according to claim 1, further comprising a lower layer wiring formed in a lower layer of the power supply wiring, and a stopper film covering an upper surface of the lower layer wiring and being under the insulating film,
    wherein the concave portion is formed to extend to the stopper film.

6. The semiconductor device according to any of claim 1 to claim 5,
    wherein the second portion has an impurity concentration higher than an impurity concentration of the first portion.

7. The semiconductor device according to claim 1,
    wherein an opening width of the concave portion is narrower than twice a film thickness of the semiconductor layer.

8. The semiconductor device according to claim 1,
    wherein each of materials of the first portion and the second portion contains polysilicon.

9. A method of manufacturing a semiconductor device, comprising the steps of:
    forming an insulating film having a surface and including a concave portion in the surface; and
    forming, over the surface of the insulating film, a semiconductor layer including a channel region and a pair of source/drain regions sandwiching the channel region and further forming a power supply wiring for supplying power to the source region,
    wherein the power supply wiring is formed to include a portion formed from the same layer as the semiconductor layer, and to have a first portion formed over the surface of the insulating film and a second portion formed in the concave portion, and so that a bottom of the second portion is covered with an insulator.

10. The method of manufacturing a semiconductor device according to claim 9,
    wherein the step of forming the semiconductor layer and the power supply wiring includes a step of implanting an impurity into the semiconductor layer and the power supply wiring, at the same time.

11. The method of manufacturing a semiconductor device according to claim 10,
    wherein the step of implanting an impurity is performed multiple times.

12. The method of manufacturing a semiconductor device according to claim 10 or 11,
    wherein the step of implanting an impurity is performed so that an impurity concentration of the second portion of the power supply wiring becomes higher than an impurity concentration of the first portion.

* * * * *